United States Patent
Ishiguro

(10) Patent No.: US 7,626,205 B2
(45) Date of Patent: Dec. 1, 2009

(54) SEMICONDUCTOR DEVICE AND ELECTRO-OPTICAL DEVICE

(75) Inventor: Hideto Ishiguro, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 176 days.

(21) Appl. No.: 11/949,370

(22) Filed: Dec. 3, 2007

(65) Prior Publication Data
US 2008/0128705 A1 Jun. 5, 2008

(30) Foreign Application Priority Data
Dec. 5, 2006 (JP) .............................. 2006-327889

(51) Int. Cl.
*H01L 27/14* (2006.01)
(52) U.S. Cl. ............................ 257/72; 257/40; 257/642; 257/643; 257/759; 257/E39.007; 257/E25.032; 428/1.1; 428/1.23; 428/1.52
(58) Field of Classification Search ................ 257/72, 257/40, 642, 643, 759, E39.007, E25.032; 428/1.1, 1.23, 1.52
See application file for complete search history.

(56) References Cited

U.S. PATENT DOCUMENTS 6,759,283 B2 * 7/2004 Yasuda et al. ............... 438/149

2008/0002084 A1 * 1/2008 Park et al. ................... 349/43

OTHER PUBLICATIONS

Mariucci et al., "Asymmetric Fingered polysilicon Thin Film Transistors for kink-effect suspension" *AM-LCD '03*, p. 57-60.
Nam et al., "Kink-current Reduced Poly-Si TFTs Employing Asymmetric Dual-Gate Design for AMOLED Pixel Elements," *IDW '04*, p. 307-310.

* cited by examiner

*Primary Examiner*—Long K Tran
(74) *Attorney, Agent, or Firm*—Oliff & Berridge, PLC

(57) ABSTRACT

A semiconductor device and an electro-optical device that ensures a stable output are provided even when there is a change in a source-drain current in a saturated operation region of a thin film transistor due to kink effects. The thin film transistor has a multi-gate structure with a polycrystalline silicon film as an active layer, and a source-side first thin film transistor portion and a drain-side second thin film transistor portion connected in series. The first thin film transistor portion has a drain-side back gate electrode that is connected with a first front gate electrode. The second thin film transistor portion has a source-side back gate electrode that is connected with a second front gate electrode.

7 Claims, 15 Drawing Sheets

SEMICONDUCTOR DEVICE AND ELECTRO-OPTICAL DEVICE

BACKGROUND

1. Technical Field

The present invention relates to a semiconductor device and an electro-optical device that uses a polycrystalline silicon film disposed over a substrate as an active layer of a thin film transistor.

2. Related Art

A thin film transistor is used as a transistor for controlling an electric current that flows into an organic electro-luminescence element of an organic electro-luminescence device. Another example of applications of a thin film transistor is a constituent element of a liquid crystal device that has analog circuits, a typical example of which is an operational amplifier, though not limited thereto, formed on the same single built-in circuit board thereof. In these non-limiting exemplary applications of a thin film transistor, the saturation characteristics of the thin film transistor are utilized in comparison with the counterpart of a MOS transistor that is formed on a silicon substrate, it is known that the saturation characteristics of a thin film transistor are relatively incomplete. Specifically, the saturation characteristics of the thin film transistor show some phenomena that indicate that a drain current increases when a drain voltage level changes. With reference to FIG. 14, these phenomena are explained below.

First Phenomenon: As illustrated in FIG. 14, due to a phenomenon called as "kink effects", the electric current of a thin film transistor has a tendency to increase at an area where the level of a drain voltage is high. That is, due to the kink effects, the rate of change in the level of a drain current relative to the level of a drain voltage tends to be large thereat. The reason why such a phenomenon occurs is considered as follows. When the level of a drain voltage is raised in the operation of a thin film transistor, a comparatively large electric field concentrates on a drain end once after the level of the drain voltage exceeds a pinch off voltage point. When the intensity of such an electric field exceeds a certain level, electrons that are accelerated by the electric field cause impact ionization so as to form a pair of an electron and a hole. In the case of a bulk type MOS transistor, since the electron hole formed as above flows toward a semiconductor substrate that serves as a bulk, it does not cause so much adverse effects on a source-drain current. In contrast, in the case of a thin film transistor, since a contact is not formed against the electron hole of a channel region, the electron hole enters the channel region to lower a potential of the channel regions As a result thereof, an electron/electronic current increases. In order to relax the concentration of an electric field at a drain end, an LDD (Lightly Doped Drain) structure, which has a lightly doped region opposed to the end portion of a gate electrode in a semiconductor layer, is frequently adopted. However, the LDD structure alone is not sufficient for completely suppressing the kink phenomenon.

Second Phenomenon: When an enhancement type transistor element is used, a pinch off voltage point Vp of a bulk type MOS transistor is defined as an operating point of a drain voltage that is smaller than a point of Vds=Vgs by an amount of Vth. Accordingly, a voltage range of a source-drain voltage Vds that is larger than the pinch off voltage point Vp constitutes a saturation region (i.e., range). In contrast a pinch off voltage point Vp of a thin film transistor is not clearly determined as illustrated in FIG. 14. Therefore, in a thin film transistor, the boundary between a linear region and the saturation region thereof spans a comparatively wide switchover voltage width therebetween. The reason for the above is considered that, according to the configuration of a thin film transistor, the potential of the channel region of the thin film transistor is determined by a relative relationship among a gate voltage, a drain voltage, and a source voltage thereof. That is, it is considered that the drain voltage has effects not only through the semiconductor layer that is the route of an electric current but also through an insulating material that is positioned at an opposite side with respect to a gate electrode. When the LDD structure is adopted as a technical solution to the first phenomenon, since the LDD region constantly provides a parasitic resistance, an effectual drain voltage that is applied to the channel region is relatively small. This is another reason for the above.

Third Phenomenon: A range between the region where a source-drain current increases, which is pointed out as the first phenomenon described above, and the pinch off voltage point, which is pointed out as the second phenomenon described above, constitutes the saturation region of a thin film transistor. However, in the case of a thin film transistor, as understood from FIG. 14, even in the saturation region thereof, the rate of change in the level of a drain current relative to the level of a drain voltage is not satisfactorily small. Thus, it is difficult to expect constant current operation.

In order to address the above-identified problematic phenomena, it is conceivable to adopt the following configurations.

Configuration A: The third problematic phenomenon will be solved if the channel length of the thin film transistor is lengthened. As another advantage, since the intensity of an electric field in the drain direction is reduced when the channel length is increased, the first problematic phenomenon is also partly solved. However, tile channel length must be made considerably large in order to achieve satisfactory characteristics thereof. Disadvantageously, since the gate capacitance increases as the channel length is increased, the high frequency characteristics of the circuit operations thereof are degraded. As another disadvantage thereof, sensitivity for increasing a current by changing a gate voltage is also degraded. As still another disadvantage thereof its scope and field of application is limited because the area occupancy of the thin film transistor increases.

Configuration B: It is known in the related art to form an LDD region at a drain end for the purpose of relaxing the intensity of an electric field at the drain end. It is possible to partly solve the first problematic phenomenon by setting the impurity dope concentration of the LDD region at a sufficiently low level and making the longitudinal dimension thereof sufficiently large. Disadvantageously, however, since the LDD region constantly provides a parasitic resistance, such a configuration considerably limits the ON current of the thin film transistor. As another disadvantage thereof, since the effectual drain voltage becomes smaller, the second phenomenon pointed out above becomes more problematic.

Configuration C: As illustrated in FIG. 15A, two thin film transistors are connected in series. With such a serial connection, a certain level of voltage Vbias is applied to the gate of one of these thin film transistors that lies at the drain side. FIG. 15B illustrates, under such a configuration, the voltage-current characteristics of the source-side thin film transistor TFTs and those of the drain-side thin film transistor TFTd with a node voltage Vm taken as a parameter. In FIG. 15B, the broken lines represent the voltage-current characteristics of the drain-side TFTd when the drain voltage Vd is changed into $Vd_1$, $Vd_2$, $Vd_3$, and $Vd_4$, respectively. The intersection of the voltage-current characteristics of the source-side TFTs and those of the drain-side TFTd that is shown in FIG. 15B represents an operating current taken when two of these thin film transistors are connected in series. As illustrated in FIG. 15C, its saturated operations are remarkably enhanced. This is a popular technique used in MOS analog circuits that employ a so-called cascode connection. Disadvantageously, however, if the cascode configuration is adopted, it becomes necessary to provide a separate circuit that can generate Vbias. As still another disadvantage thereof, the input range of Vgate will be limit ed.

Configuration D: As illustrated in FIG. 16A, it is possible to offer advantageous operational effects that are similar to those achieved when the configuration C described above is adopted by connecting two thin film transistors in series and by electrically connecting the gate of one of these two thin film transistors with the gate of the other thereof, thereby integrating Vbias and Vgate into common one. FIG. 16B illustrates, under such a configuration, the voltage-current characteristics of the source-side TFTs and those of the drain-side TFTd with a node voltage Vm taken as a parameter. In FIG. 16B, the broken lines represent the voltage-current characteristics of the drain-side TFTd when the drain voltage Vd is changed into $Vd_1$, $Vd_2$, $Vd_3$, and $Vd_4$, respectively. The intersection of the voltage-current characteristics of the source-side TFTs and those of the drain-side TFTd that is shown in FIG. 16B represents an operating current taken when two of these thin film transistors are connected in series. As illustrated in FIG. 16C, its saturated operations are remarkably enhanced. Examples of the above-described configurations are disclosed n, for example, "L. Mariucci et al., AM-LCD '03 pp. 57-60" and "Woo-Jin Nam et al., IDW'04 pp. 307-310".

In a case where the configuration D that is explained while making reference to FIG. 16 is adopted, it is clear that the operating point of TFTd is limited into the neighborhood of the pinch off voltage point Vp of TFTs. It is thus impossible to obtain expected advantageous operational effects if the operating point thereof falls within the linear operation range of TFTs. For this reason, in order to obtain a good operating point, for example, it is necessary to set a value calculated as the result of dividing the channel width Wd of TFTd by the channel length Ld thereof (Wd/Ld) several times as large as a value calculated as the result of dividing the channel width Ws of TFTs by the channel length Ls thereof (Ws/Ls). Disadvantageously, such a requirement significantly narrows the freedom of layout design.

As the voltage-current characteristics of a typical thin film transistor, the inclination of Ids relative to Vds tends to be large in the vicinity of the pinch off voltage point Vp. For this reason, in order to address the second problematic phenomenon described above, it is necessary to set a considerably large ratio that is computed as (Wd/Ld)/(Ws/Ls). Therefore, if the layout thereof is designed without going beyond an ordinary boundary of engineer's design discretion, gate capacitance increases to cause the degradation in the high frequency characteristics of the circuit operations thereof; and in addition thereto, the area occupancy of the thin film transistor increases disadvantageously.

SUMMARY

An advantage of some aspects of the invention is to provide a semiconductor device and an electro-optical device that ensures a stable output even when there is a change in a source-drain current in a saturated operation region of a thin film transistor due to kink effects.

In order to address the above-identified problems without any limitation thereto, the invention provides, as a first aspect thereof, a semiconductor device including: a substrate; and a thin film transistor that uses a polycrystalline silicon film disposed over the substrate as an active layer thereof, wherein the polycrystalline silicon film is sandwiched between a first gate insulation layer and a second gate insulation layer, the thin film transistor has a first thin film transistor portion and a second thin film transistor portion, the first thin film transistor portion having a first channel region and a first front gate electrode, the first channel region being formed at the drain-side position of the polycrystalline silicon film, the first front gate electrode being opposed to the first channel region with the first gate insulation layer being sandwiched therebetween, the second thin film transistor portion having a second channel region and a second front gate electrode, the second channel region being formed at a source-side position adjacent indirectly to the drain-side first channel region with an impurity implantation region being interposed therebetween in the polycrystalline silicon film, the second front gate electrode being opposed to the second channel region with the first gate insulation layer being sandwiched therebetween, the first thin film transistor portion has the same conductivity type as that of the second thin film transistor portion, the first thin film transistor portion and the second thin film transistor portion being connected in series, the first front gate electrode and the second front gate electrode are electrically connected to each other, and a source-side back gate electrode is formed at a region that is opposed to the second channel region with the second gate insulation layer being sandwiched therebetween, a source potential being applied to the source-side back gate electrode.

In the configuration of the semiconductor device according to the first aspect of the invention described above, the drain-side first thin film transistor portion and the source-side second thin film transistor portion, which is adjacent to the drain-side first thin film transistor portion, are connected in series. In addition, the gate electrode of the drain-side first thin film transistor portion and the gate electrode of the source-side second thin film transistor portion are electrically connected to each other. With such a configuration, the operating point thereof lies in the proximity of the pinch off voltage point of the source-side second thin film transistor portion. For this reason, it is possible to make the rate of change in the level of a drain current due to kink effects in the saturation region smaller. In addition, since the source-side back gate electrode to which a source potential is applied is formed in the source-side second thin film transistor portion, it is possible to make the conductance of the source-side second thin film transistor portion low relative to the conductance of the drain-side first thin film transistor portion without any necessity to set a value calculated as the result of dividing the channel width of the drain-side first thin film transistor portion by the channel length thereof significantly larger than a value calculated as the result of dividing the channel width of the source-side second thin film transistor portion by the channel length thereof. For this reason, it is further possible to prevent the operating point from falling within the linear operation range of the source-side second thin film transistor in a reliable manner. Therefore, as in a case where two thin film transistor portions are cascode connected, it is possible to make the rate of change in the level of a drain current in the saturation region smaller without any necessity to add a bias-generating circuit, thereby remarkably enhancing the saturated operations thereof.

In the configuration of the semiconductor device according to the first aspect of the invention described above, it is preferable that the source-side back gate electrode should be formed at a region overlapping a part of the second channel region extending from the source end to a halfway point without reaching the drain end thereof. In other words, it is preferable to form the source-side back gate electrode at a region that leaves a non-overlapping distance extending from the above-mentioned halfway point that falls short of the drain end of the second channel region to the drain end thereof. The preferred configuration described above makes it possible to eliminate the adverse effects of a vertical electric field exerted from the source-side back gate electrode at the drain end of the second channel region.

In the configuration of the semiconductor device according to the first aspect of the invention described above, it is preferable that a drain-side back gate electrode that is electrically connected to the first front gate electrode should be formed at a region that; is opposed to the first channel region with the second gate insulation layer being sandwiched therebetween. Since such a configuration makes the conductance of the drain-side first thin film transistor portion high relative to the conductance of the source-side second thin film transistor portion, as in a case where two thin film transistor portions are cascode connected, it is possible to make the rate of change in the level of a drain current in the saturation region smaller without any necessity to add a bias-generating circuit, thereby remarkably enhancing the saturated operations thereof.

In the configuration of the semiconductor device according to the first aspect of the invention described above, it is preferable that the drain-side back gate electrode should be formed at a region overlapping a part of the first channel region extending from the source end to a halfway point without reaching the drain end thereof. In other words, it is preferable to form the drain-side back gate electrode at a region that leaves a non-overlapping distance extending from the above-mentioned halfway point that falls short of the drain end of the first channel region to the drain end thereof. The preferred configuration described above makes it possible to eliminate the adverse effects of a vertical electric field exerted from the drain-side back gate electrode at the drain end of the first channel region.

In the configuration of the semiconductor device according to the first aspect of the invention described above, the second gate insulation layer, the polycrystalline silicon film, and the first gate insulation layer may be laminated over the substrate in the order of appearance herein.

In the configuration of the semiconductor device according to the first aspect of the invention described above, the first gate insulation layer, the polycrystalline silicon film, and the second gate insulation layer may be laminated over the substrate in the order of appearance herein.

The semiconductor device to Which the invention is applied can be used for a display device of a variety of electronic apparatuses such as a mobile phone, a mobile computer, and the like. As another example of applications thereof, the semiconductor device to which the invention is applied can be used for an electro-optical device such as a print head, where the semiconductor device is an element substrate having a plurality of pixels formed thereon. In such an electro-optical device, a thin film transistor to which the invention is applied can be used, for example, for driving an organic EL element provided on each pixel, or used as a constituent element of an analog circuit such as an operational amplifier provided on an element substrate of a liquid crystal device as a driving circuit thereof. Among these exemplary applications, if the thin film transistor according to the invention is used for driving an organic EL element, it is possible to reduce a leak current at the time of black display, which results in improved contrast. In addition, since a driving current does not change even when there is a variation in power supply voltage that is attributable to resistance in power supply wiring patterned inside a display panel, it is possible to achieve uniform image display, thereby making it further possible to offer a display device featuring its large capacity and large screen size. If the thin film transistor according to the invention is used as a constituent element of an analog circuit of an operational amplifier, it is possible to configure an output buffer that offers an excellent linearity with a small offset. Therefore, it is possible to provide a high-definition liquid display device. Although an offset causes the flickering and/or "burning" of a display image, the invention provides a technical solution to such problematic phenomena that are otherwise caused by the offset.

BRIEF DESCRIPTION OF THE DRAWINGS

The invention will be described with reference to the accompanying drawings, wherein like numbers reference like elements.

FIG. 1A is a general circuit diagram that schematically illustrates an example of the electric configuration of an organic EL device to which the invention is applied, whereas

FIG. 3A is a plan view of a current-controlling thin film transistor according to the first exemplary embodiment of the invention, whereas

FIG. 9A is a plan view of a current-controlling thin film transistor according to an improvement example of the first exemplary embodiment of the invention, whereas

FIG. 10A is a plan view of a current-controlling thin film transistor according to the second exemplary embodiment of the invention, whereas

FIG. 12A is a plan view of a current-controlling thin film transistor according to an improvement example of the second exemplary embodiment of the invention, whereas

DESCRIPTION OF EXEMPLARY EMBODIMENTS

With reference to the accompanying drawings, exemplary embodiments of the invention are explained below. It should be noted that different scales are used for layers/members illustrated in each of the accompanying drawings that are referred to in the following explanation so that each of the layers/members illustrated therein has a size that is easily recognizable. As an example of a variety of semiconductor devices that has a thin film transistor to which the invention is applicable, the invention is explained while discussing a thin film transistor provided on an element substrate (semiconductor device) that constitutes a part of an organic electroluminescence (EL) device in which the thin film transistor drives an organic EL element provided thereon.

Embodiment 1

General Configuration of Light-emitting Device

Figure 1A:
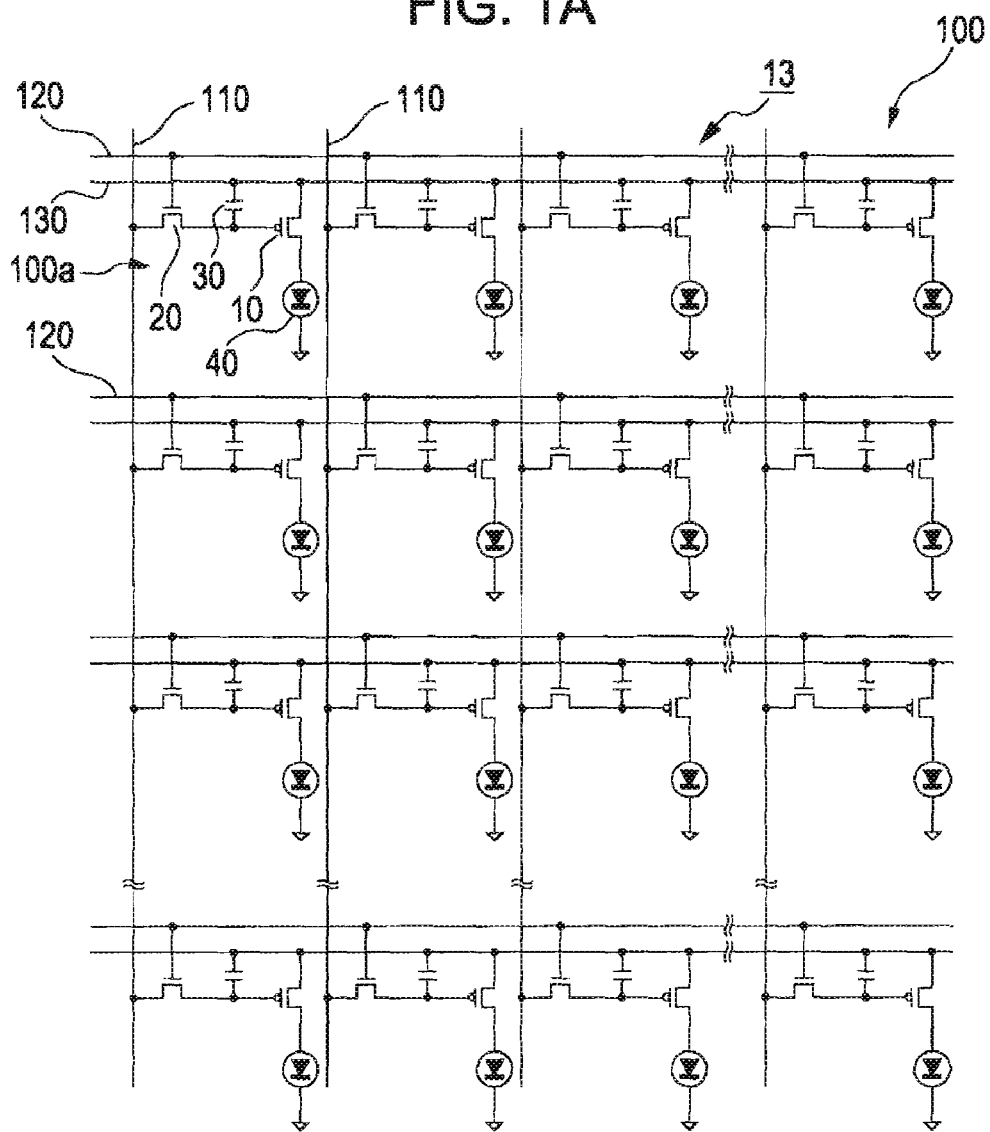
Figure 1B:
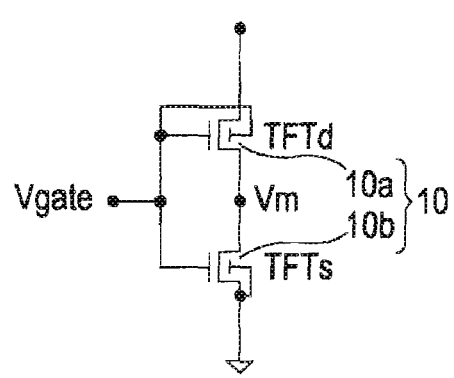
FIG. 1B is an equivalent circuit diagram of a thin film transistor for electric current control to which the invention is applied.

FIG. 1A is a general circuit diagram that schematically illustrates an example of the electric configuration of an organic EL device to which the invention is applied, whereas FIG. 1B is an equivalent circuit diagram of a thin film transistor for electric current control to which the invention is applied. A light-emitting device (apparatus) 100 that is illustrated in FIG. 1 is configured to drive an organic EL element 40, which emits light when a driving current flows through the organic EL element 40, by means of a thin film transistor. Such a type of light-emitting device does not require any backlight because the organic EL element 40 emits light in a self-luminous manner. As another example of advantages thereof, it offers less angle-dependent visibility.

The light-emitting device 100 has a plurality of scanning lines 120, a plurality of data lines 110 that extend in a direction orthogonal to the extending direction of the scanning lines 120, a plurality of common power feed lines 130 that extend in parallel with the scanning lines 120, and pixels 100a each of which is provided at a position corresponding to the intersection defined by each of the data lines 110 and each of the scanning lines 120. These components are formed on an element substrate 13 of the light-emitting device 100. The pixels 100a are arrayed in a matrix pattern an image display area. On the element substrate 13, a data line driving circuit, which is not shown in the drawing, is formed for driving the data line 110. The data line driving circuit is provided with a shift register, a level shifter, a video line, and an analog switch. On the other hand, a scanning line driving circuit, which is not shown in the drawing, is formed on the element substrate 13 for driving the scanning line 120. The scanning line driving circuit is provided with a shift register and a level shifter. Each of the plurality of pixels 100a has a pixel-switching thin film transistor 20, a retention volume (i.e., hold capacitor) 30, a current-controlling thin film transistor 10, and the organic EL element 40. A scanning signal is supplied to the gate electrode of the pixel-switching thin film transistor 20 through the scanning line 1-20. The retention volume 30 holds an image signal that is supplied from the data line 110 via the pixel-switching thin film transistor 20. The image signal that is held by the retention volume 30 is supplied to the gate electrode of the current-controlling thin film transistor 10. When the organic EL element 40 is electrically connected to the common power feed line 130 through the current-controlling thin film transistor 10, a driving current flows from the common power feed line 130 into the organic EL element 40.

Configurations of Organic EL Element and Element Substrate

Figure 2:
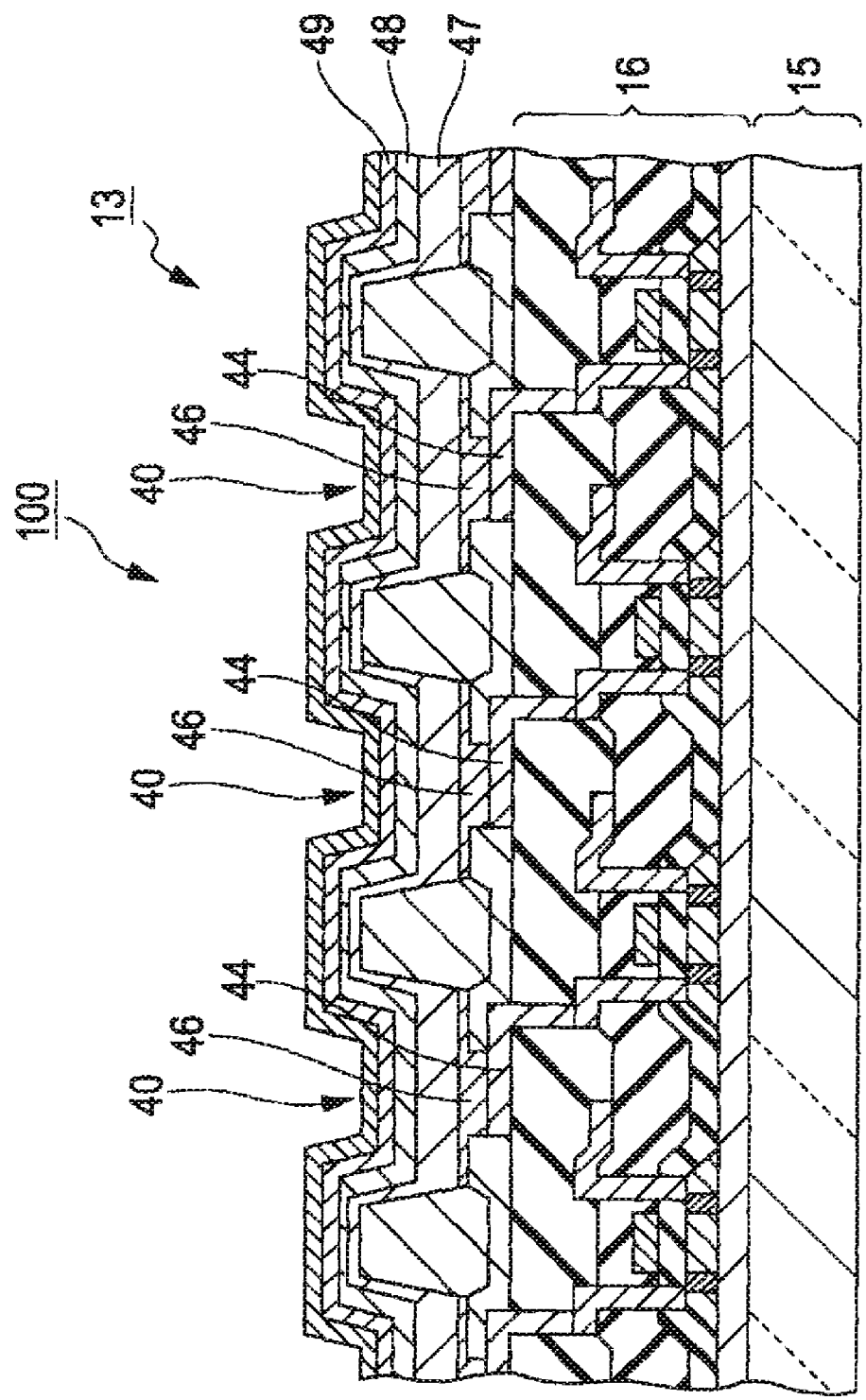
FIG. 2 is a sectional view that schematically illustrates an example of an element substrate that is provided with organic EL elements.

FIG. 2 is a sectional view that schematically illustrates an example of an element substrate that is provided with organic EL elements. As illustrated in FIG. 2, the organic EL element 40 has a laminated structure formed in the element substrate 13. Specifically, the laminated structure of the organic EL element 40 is made up of, as an exemplary configuration thereof, a pixel electrode 44 that functions as an anode, a hole transport layer 46 that injects/transports a hole from the pixel electrode 44, a light-emitting layer (i.e., organic EL functional layer) 47 that is made of an organic EL material, an electron injection layer 48 that injects/transports an electron, and a cathode 49, which are laminated in the order of appearance herein. In a case where the light-emitting device 100 is configured as a bottom-emission type device that outputs light which was emitted by the light-emitting layer 47 from the pixel-electrode (44) side thereof, the emitted light goes out from the substrate side of the element substrate 13. For this reason, a transparent substrate 15 such as glass, quartz, resin (plastic sheet/plate, plastic film), or the like, is used as the base substance of the element substrate 13. A preferable example of the transparent substrate 15 is a glass substrate.

As schematically illustrated in the drawing, a circuit layer structure 16 is formed under the organic EL element 40 on the element substrate 13. The circuit layer structure 16 includes but not limited to the data lines 110, the scanning lines 120, the common power feed lines 130, the pixel-switching thin film transistors 20, the retention volumes 30, the current-controlling thin film transistors 10, which are explained above while making reference to FIG. 1A.

Configuration of Current-Controlling Thin Film Transistor

Figure 3A:
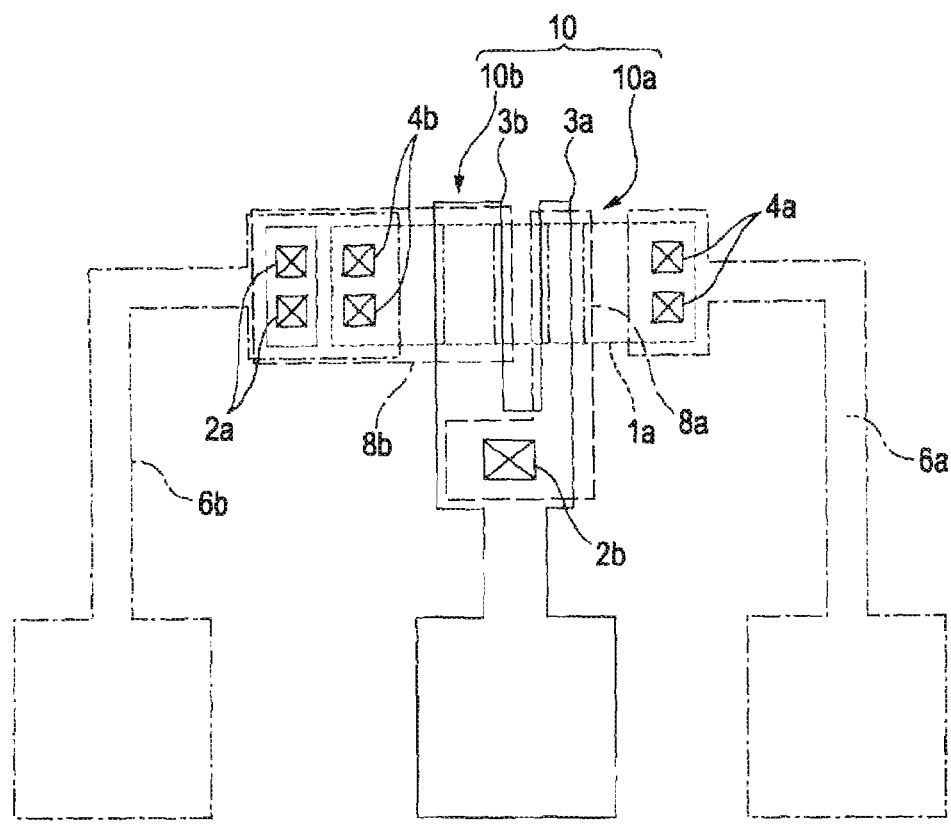
Figure 3B:
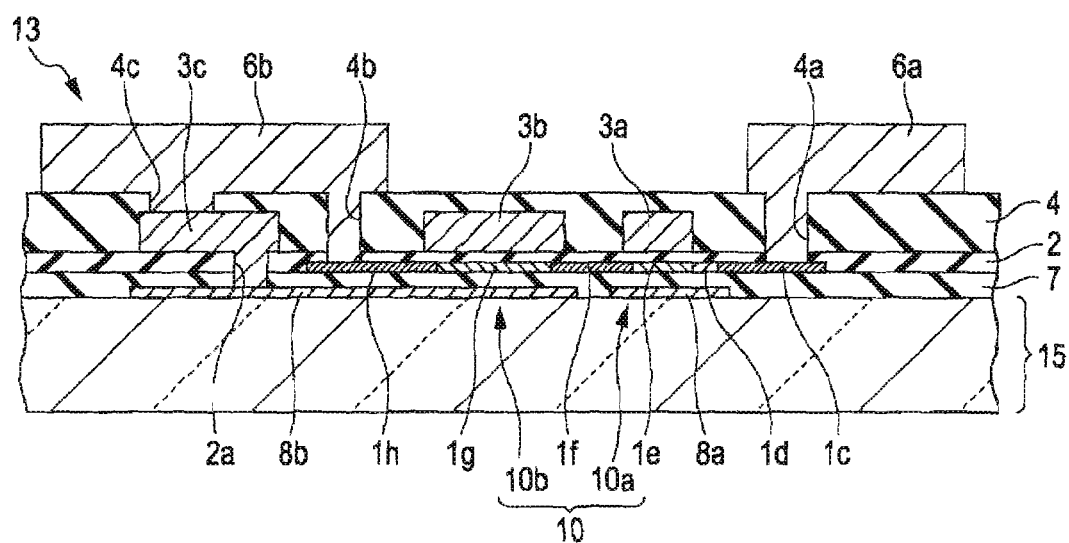
FIG. 3B is a sectional view thereof.

FIG. 3A is a plan view of a current-controlling thin film transistor that is used in a light-emitting device according to the present embodiment of the invention. FIG. 3B is a sectional view thereof. An example illustrated herein has a laminated structure that is made up of a back gate electrode, a lower-layer-side gate insulation layer (a second gate insulation layer), a polycrystalline silicon film, an upper-layer-side gate insulation layer (a first gate insulation layer), and a front gate electrode, which are laminated in the order of appearance herein. In FIG. 3A, a short dashed line indicates the polycrystalline silicon film. A solid line indicates the front gate electrode. An alternate long and short dash line indicates a source-drain electrode. A long dashed line indicates the back gate electrode. A two-dot chain line indicates each boundary between regions of the polycrystalline silicon film.

In the present embodiment of the invention, a multi-gate structure (i.e., configuration D) explained above while making reference to FIGS. 16A, 16B, and 16C is adopted when configuring the current-controlling thin film transistor 10 illustrated in FIG. 1A. As illustrated in FIG. 1B, in such a multi-gate configuration, the drain-side thin film transistor (TFTd) and the source-side thin film transistor (TFTs) are connected in series. In addition, the gate electrode (i.e., front gate) of the drain-side thin film transistor TFTd and the gate electrode (front gate) of the source-side thin film transistor TFTs are electrically connected to each other.

In addition in the configuration of the current-controlling thin film transistor 10 according to the present embodiment of the invention, each of the drain,-side thin film transistor TFTd and the source-side thin film transistor TFTs is provided with a back gate. The back gate of the drain-side thin film transistor TFTd, which is referred to as the drain-side back gate hereunder, is electrically connected to the front rate thereof. A source potential (source voltage) is applied to the back gate of the source-side thin film transistor TFTs, which is referred to as the source-side back gate hereunder.

As illustrated in FIGS. 3A and 3B, in a formation process of the current-controlling thin film transistor 10, a base ground (i.e., underlying) protective film made of a silicon oxide film, a silicon nitride film, or the like, which is not shown in the drawings, is formed on the transparent substrate 15 of the element substrate (semiconductor device) 13 according to the present embodiment of the invention; and then, a drain-side back gate electrode 8a and a source-side back gate electrode 8b are formed on the surface of the base ground protective film. A lower-layer-side gate insulation layer (a second gate insulation layer) 7 is deposited on the drain-side back gate electrode 8a and the source-side back gate electrode 8b.

An "island-shaped" isolated polycrystalline silicon film 1a is formed on the lower-layer-side gate insulation layer 7. The polycrystalline silicon film 1a is a film formed by, as a first step, depositing an amorphous silicon film on the lower-lyer-side gate insulation layer 7, and then by processing the film into polycrystalline one by means of laser annealing, lamp annealing, or the like. An upper-layer-side gate insulation layer (a first gate insulation layer) 2 made of a silicon oxide film, a silicon nitride film, or the like is deposited on the surface of the polycrystalline silicon film 1a.

The thin film transistor 10 according to the present embodiment of the invention has a first n-channel thin film transistor portion 10a that has a first channel region 1e formed at the drain-side position of the polycrystalline silicon film 1a and a second n-channel thin film transistor portion 10b that is formed at the source-side position adjacent to the drain-side first n-channel chin film transistor portion 10a. The second thin film transistor portion 10b has a second channel region 1g that is formed at a source-side position opposite to the drain-side first channel region 1e with a highly doped n-type region 1f (i.e., impurity implantation region) being interposed therebetween in the polycrystalline silicon film 1a. The first thin film transistor portion 10a and the second thin film transistor portion 10b are connected in series so as to form the n-channel thin film transistor 10. It should be noted that the channel length of the first thin film transistor portion 10a is set to be shorter than the channel length of the second thin film transistor portion 10b.

The first thin film transistor portion 10a has a first front gate electrode 3a at a position opposed to the first channel region 1e with the upper-layer-side gate insulation layer 2 being sandwiched therebetween. On the other hand, the second thin film transistor portion 10b has a second front gate electrode 3b at a position opposed to the second channel region 1g with the upper-layer-side gate insulation layer 2 being sandwiched therebetween. The front gate electrode 3a and the front gate electrode 3b are electrically connected to each other at a certain side/peripheral position of the polycrystalline silicon film 1a.

The first thin film transistor portion 10a has an LDD structure however, the first thin film transistor portion 10a -has a lightly doped n-type region 1d only at a position that is adjacent to the first channel region 1e at the drain side thereof. That is, the first thin film transistor portion 10a has not any lightly doped n-type region at a position that is adjacent to the first channel region 1e at the source side thereof. The second thin film transistor portion 10b has neither an LDD structure nor a self-aligned structure. The second channel region 1g of the second thin film transistor portion 10b is formed at a region of the polycrystalline silicon film 1a that overlaps (i.e., underlies) the central region of the second front gate electrode 3b only when viewed along the longitudinal direction thereof, meaning that it does not extend beyond the area overlapping the central region thereof. With the configuration described above, the polycrystalline silicon film 1a has a highly doped n-type region 1c, the lightly doped n-type region 1d, the first channel region 1e, the highly doped n-type region 1f, the second channel region 1g, and a highly doped n-type region 1h, which are formed/arrayed in the order of appearance herein when viewed from the drain side toward the source side thereof. The highly doped n-type region 1c, the lightly doped n-type region 1d, the first channel region 1e, and the highly doped n-type region 1f constitute the first thin film transistor portion 10a. The highly doped n-type region 1f, the second channel region 1g, and the highly doped n-type region 1h constitute the second thin film transistor portion 10b. The highly doped n-type region 1f functions as a node for the first thin film transistor portion 10a and the second thin film transistor portion 10b.

In the present embodiment of the invention, the lightly doped n-type region 1d is configured as a region that is formed by implanting lightly doped n-type impurity ion (phosphorus ion) in a dose amount ranging from, for example, approximately $0.1\times10^{13}/m^2$ to approximately $10\times10^{13}/cm^2$ while using each of the first front gate electrode 3a and the second front gate electrode 3b as a mask. The impurity dope concentration of tightly doped n-type region id ranges from, for example, approximately $0.1\times10^{18}/cm^3$ to approximately $1\times10^{18}/cm^3$. Therefore, the lightly doped n-type region 1d is formed in a self-aligned manner with respect to the firs: front gate electrode 3a. On the other hand, each of the highly doped n-type regions 1c, 1f, and 1h is configured as a region that is formed by implanting highly doped n-type impurity ion (phosphorus ion) in a dose amount ranging from, for example, approximately $0.1\times10^{15}/cm^2$ to approximately $10\times10^{15}/cm^2$ while using resist masks as a mask. The impurity dope concentration of each of the highly doped n-type regions 1c, 1f, and 1h ranges from, for example, approximately $0.1\times10^{20}/cm^3$ to approximately $10\times10^{20}/cm^3$.

An inter-bedded insulator film 4 is deposited on the first front gate electrode 3a and the second front gate electrode 3b. A drain electrode 6a is electrically connected to the highly doped n-type region 1c via a contact hole 4a that is formed so as to go through tie inter-bedded insulator film 4. A source gate 6b is electrically connected to the highly doped n-type region 1h via a contact hole 4b that is formed so as to go through the inter-bedded insulator film 4.

A relay electrode 3c is formed on the upper-layer-side gate insulation layer 2 in the same electrode formation process as that applied to the first front gate electrode 3a and the second front gate electrode 3b. The relay electrode 3c is electrically connected to the source-side back gate electrode 8b via a contact hole 2a that goes through the upper-layer-side gate insulation layer 2 and the lower-layer-side gate insulation layer 7. The inter-bedded insulator film 4 has a contact hole 4c through which the source electrode 6b is electrically connected to the relay electrode 3c. Therefore, the source-side back gate electrode 8b is electrically connected to the source electrode 6b via the relay electrode 3c so as to allow a source voltage/potential to be applied thereto.

A contact hole 2b that goes through the upper-layer-side gate insulation layer 2 and the lower-layer-side gate insulation layer 7 is formed at a certain side/peripheral position of the polycrystalline silicon film 1a. The first front gate electrode 3a and the drain-side back gate electrode 8a are electrically connected to each other via the contact hole 2b.

Advantageous Effects of Present Embodiment of Invention

Figure 4A:
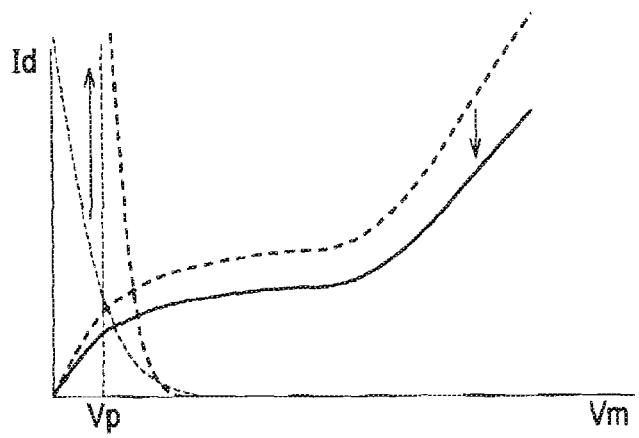
FIG. 4 is a set of voltage-current characteristic diagrams that illustrates the advantageous effects of the thin film transistor to which the invention is applied.
Figure 4B:
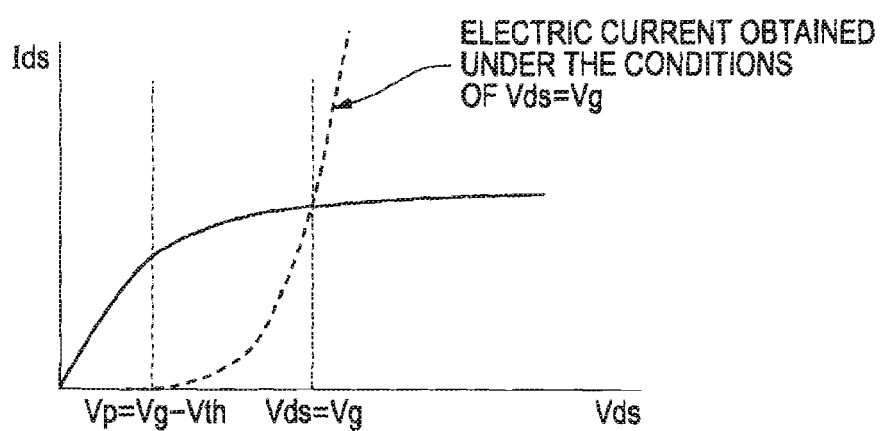
Figure 4C:
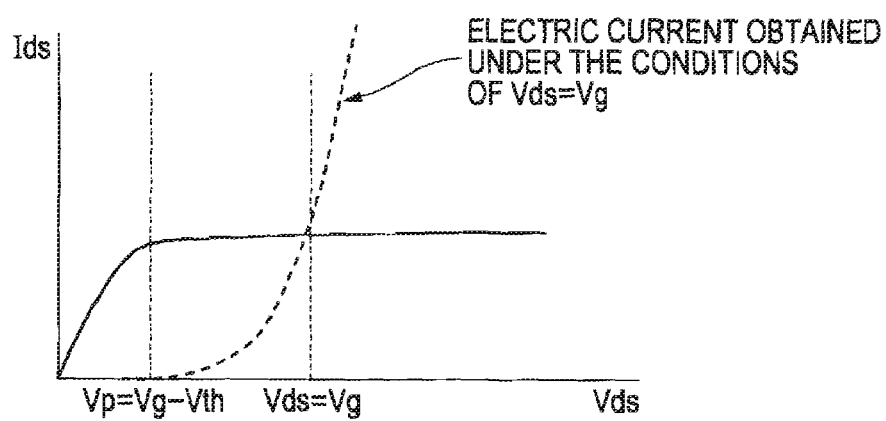
Figure 5:
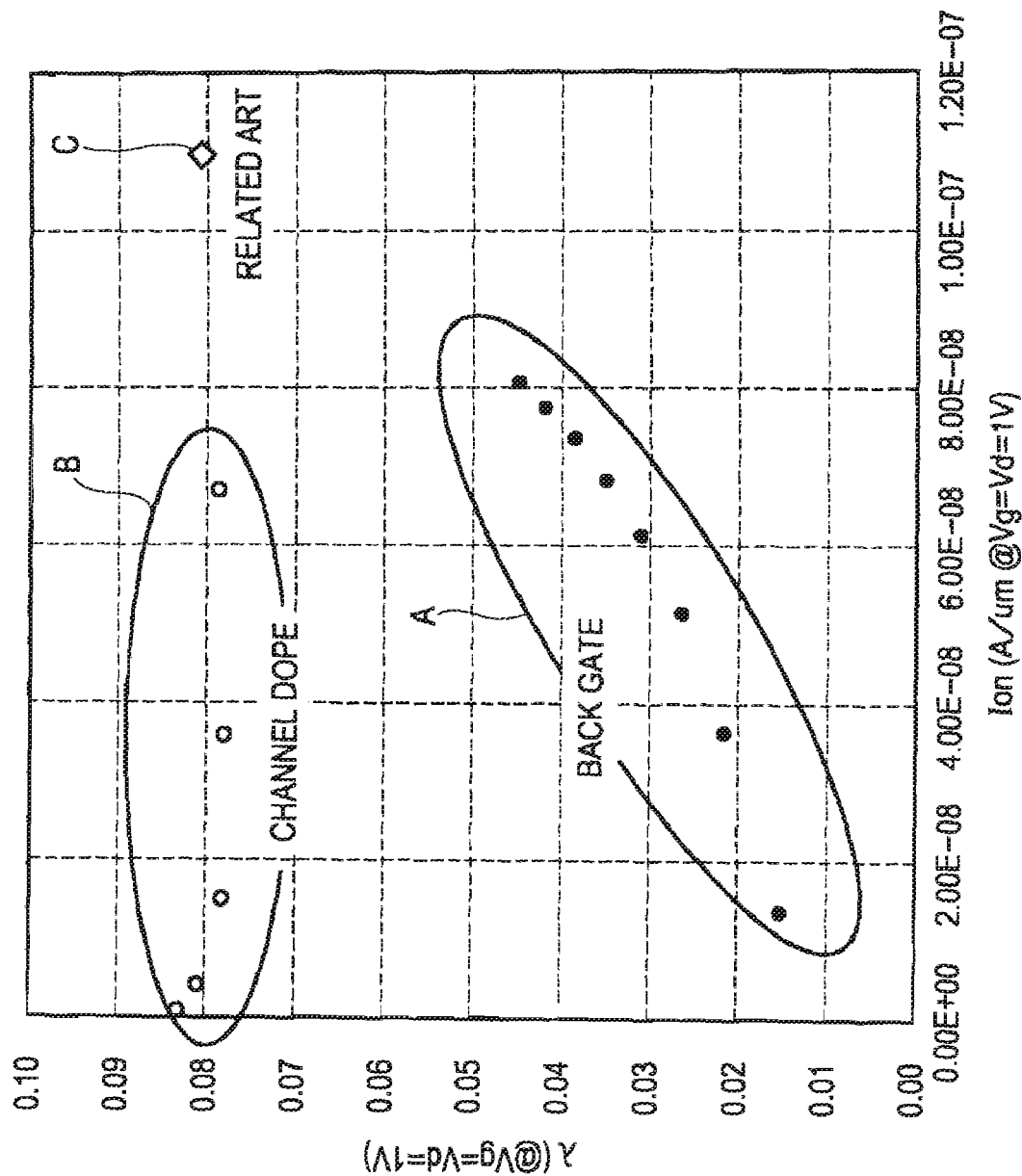
FIG. 5 is an explanatory diagram that illustrates the saturation characteristics of the thin film transistor to which the invention is applied, which are shown in comparison with related art and a reference example.

With reference to FIGS. 4, 5, and 6, advantageous effects of a thin film transistor to which the invention is applied are explained below. FIG. 4 is a set of voltage-current characteristic diagrams that illustrates the advantageous effects of the thin film transistor to which the invention is applied. Specifically each of FIGS. 4A, 4B, and 4C is a graph that shows the voltage-current characteristics of thin film transistor portions that make up the thin film transistor to which the invention is applied. FIG. 5 is an explanatory diagram that illustrates the saturation characteristics of the thin film transistor to which the invention is applied, which are shown in comparison with related art and a reference example. FIG. 6 is a set of graphs that illustrates the voltage-current characteristics of the thin film transistor to which the invention is applied and those of a thin film transistor of related art with a gate voltage being changed for each thereof.

Figure 16A:
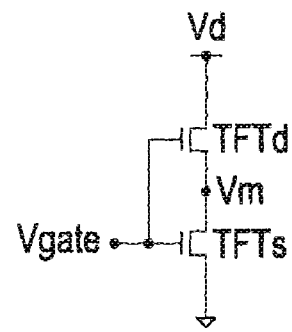
FIG. 16 is a set of explanatory diagrams that illustrates a thin film transistor having a multi-gate structure.
Figure 16B:
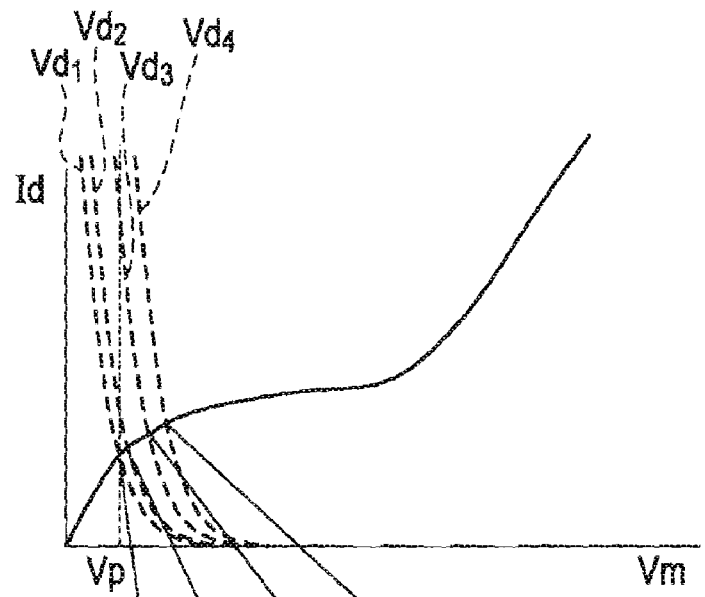
Figure 16C:
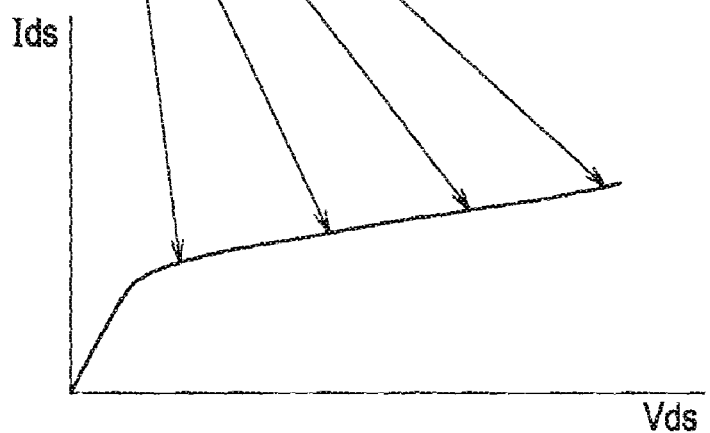

The thin film transistor 10 according to the present embodiment of the invention adopts the configuration D that is explained above while making reference to FIG. 16. The first thin film transistor portion 10a corresponds to the drain-side thin film transistor TFTd that is illustrated in FIG. 16A. The second thin film transistor portion 10b corresponds to the source-side thin film transistor TFTs that is illustrated in FIG. 16A. The highly doped n-type region "1f" corresponds to the node illustrated in FIG. 16A. FIG. 16B illustrates the voltage-current characteristics of the first thin film transistor portion 10a (TFTd) and those of the second thin film transistor portion 10b (TFTs) with the node voltage Vm taken as a parameter. In FIG. 16B, the broken lines represent the voltage-current characteristics of the drain-side TFTd when the drain voltage Vd is changed into $Vd_1$, $Vd_2$, $Vd_3$, and $Vd_4$, respectively. The intersection o the voltage-current characteristics of the source-side TFTs and those of the drain-side TFTd that is shown in FIG. 16B represents an operating current taken when two of these thin film transistors are connected in series. The operating characteristics of the thin film transistor are schematically illustrated in FIG. 16C. Therefore, the operating point of the thin film transistor 10, lies in the proximity of the pinch off voltage point of the source-side second thin film transistor portion 10b. Therefore, it is possible to avoid the kink effects of the second thin film transistor portion 10b.

In addition, in the configuration of the current-controlling thin film transistor 10 according to the present embodiment of the invention, the first thin film transistor portion 10a and the second thin film transistor portion 10b are provided with the drain-side back gate electrode 8a and the source-side back gate electrode 8b, respectively. The back gate electrode 8a of the drain-side thin film transistor TFTd is electrically connected to the first front gate electrode 3a thereof. A source potential/voltage is applied to the back gate electrode 8b of the source-side thin film transistor TFTs. With such a configuration, as illustrated in FIG. 4A, it is possible to make a conductance "gm" of the source-side second thin film transistor portion 10b relatively low and to make the conductance gm of the drain-side first thin film transistor portion 10a relatively high. For this reason, it is further possible to set the operating point of the thin film transistor 10 at a position where Vm is higher than the pinch off voltage point of the second thin film transistor portion 10b without any necessity to set a value calculated as the result of dividing the channel width Wa of the first thin film transistor portion 10a by the channel length La thereof (Wa/La) significantly larger than a value calculated as the result of dividing the channel width Wb of the second thin film transistor portion 10b by the channel length Lb thereof (Wb/Lb). In such a region, the inclination of the source-drain current Ids relative to the source-drain voltage Vds is small.

For this reason, as explained later while making reference to FIGS. 5 and 6, it is possible to make the rate of change in the level of a drain current in the saturation region smaller without increasing the area occupancy of the thin film transistor 10, thereby remarkably enhancing the saturated operations thereof.

In addition to the advantageous effect of making the conductance gm of the source-side second thin film transistor portion 10b relatively low, the application of a source voltage/potential to the source-side back gate electrode 8b offers another advantageous effect that is explained below while making reference to FIGS. 4B and 4C. FIG. 4B is an explanatory diagram that illustrates the saturation characteristics of a thin film transistor of related art. This drawing shows a region where Vds is relatively small. FIG. 4C is an explanatory diagram that illustrates the saturation characteristics of a bulk type MOS transistor with a potential/voltage of a silicon substrate (bulk) taken as a source potential/voltage thereof. This drawing shows a region where Vds is relatively small. In each of FIGS. 4B and 4C, the pinch off voltage point Vp is set at a value that is defined on the basis of a threshold voltage Vth. The threshold voltage Vth is calculated on the basis of a current value obtained when Vds equals Vgs (Vds=Vgs). As illustrated in FIG. 4C, in the bulk type MOS transistor, the potential/voltage of the channel region thereof is determined by relationships among a source voltage, a drain voltage, a gate voltage, and a substrate voltage. Since there is no electrode that determines a substrate potential/voltage in thin film transistors of related art, the drain voltage has a relatively large contribution ratio in determination of the potential/voltage of the channel region. For this reason, in a typical thin film transistor of related art, since the potential/voltage of the channel region in the proximity of the drain region depends heavily on a drain voltage, it becomes difficult to obtain sufficient saturation characteristics as the drain voltage changes. In contrast, in the thin film transistor according to the present embodiment of the invention, since a source potential/voltage is applied to the source-side back gate electrode 8b thereof, it is possible to achieve saturation characteristics that are close to those of a bulk type MOS transistor. Therefore, it is possible to make the rate of change in the level of a drain current in the saturation region smaller, thereby remarkably enhancing the saturated operations thereof.

Referring to FIG. 5, the region A shows the relationship between an electric current value obtained when Vd equals Vg (Vd=Vg) and an inclination of the electric current value obtained when Vd equals Vg (Vd=Vg) with respect to a drain voltage under the conditions that, in the configuration of the thin film transistor 10 illustrated in FIG. 3, the channel length Lb is set at 5 μm, Vgs is set at 1V, and the thickness of the lower-layer-side gate insulation layer 7 is changed from 75 nm to 600 nm. Herein, the inclination of the electric current value obtained when Vd equals Vg (Vd=Vg) with respect to the drain voltage is defined as λ in the following mathematical formula.

$$Ids=A(1+\lambda \cdot Vds).$$

Therefore, it can be said that more excellent saturation characteristics are achieved as λ becomes smaller.

The region B illustrated in FIG. 5 shows, as a comparative example of λ, a case where the conductance gm of the source-side second thin film transistor portion 10*b* is set relatively low and the conductance gm of the drain-side first thin film transistor portion 10*a* is set relatively high by changing a threshold voltage by means of channel doping without forming any back gate electrode. As for channel doping, the region B shows a result of changing the channel doping concentration thereof from $1.5\times10^{16}$ cm$^3$ to $5.5\times10^{16}$ cm$^3$. The diamond dot C illustrated in FIG. 5 plots a related art example in which no back gate electrode formation nor channel doping is done.

As understood from FIG. 5, in the thin film transistor 10 to which the invention is applied, λ increases as the thickness of the lower-layer-side gate insulation layer 7 increases. While it might seem that the current of the source-side second thin film transistor portion 10*b* may be set at a low level, in a practical sense, it is not preferable to set it at an extremely low level because it will cause an increase in power supply voltage and power consumption. Therefore, although it is optimum to set the thickness of the lower-layer-side gate insulation layer 7 to be 225 nm, such conditions may be determined into an optimum value depending on required saturation characteristics.

As a disadvantageous aspect, there arises a problem when back gate electrodes are formed on a single gate thin film transistor that has one channel region and when a source potential/voltage is applied thereto. That is, in addition to an electric field that accompanies a drain voltage, additional electric field is applied in the direction of film thickness because of the back gate electrodes to a semiconductor region that lies closer to a drain electrode than a drain end. For this reason, impact ionization is disadvantageously promoted so as to worsen kink effects. Moreover, the upper limit of available Vds is lowered. Notwithstanding the foregoing, in the configuration of the thin film transistor 10 according to the present embodiment of the invention, the first thin film transistor portion 10*a* and the second thin film transistor portion 10*b* are connected in series; and in such a configuration, an original/primary gate-electrode voltage of the drain-side first thin film transistor portion 10*a* (i.e., a voltage of the front gate electrode of the drain-side first thin film transistor portion 10*a*) is applied to the drain-side back gate thereof. For this reason, since the electric field exerted in the direction of film thickness at the drain end is mitigated in comparison with a case of a source potential/voltage, the invention provides a solution to the problem of kink effects. In addition, since the conductance gm of the drain-side first thin film transistor portion 10*a* is raised, it is possible to achieve stable saturated operations in a wide drain voltage range and in a wide gate voltage range. Moreover, since the source-side back gate electrode 8*b* is connected to the source electrode 6*b* so as to improve the saturation characteristics of the source-side second thin film transistor portion 10*b* at the operating point according to the invention, excellent combined saturation characteristics offered by the serial connection of the first thin film transistor portion 10*a* and the second thin film transistor portion 10*b* are ensured. Although saturation characteristics depend also on the original nature of a semiconductor film or the like, it is possible to achieve, for example, 0.003 as the value of λ if the invention described herein is adopted. Such a value is sufficient for a thin film transistor to be used as a transistor for controlling an electric current (i.e., driving transistor) that flows into an organic electro-luminescence element of an organic electro-luminescence device, or as a constituent element of a liquid crystal device that has analog circuits, a typical example of which is an operational Amplifier, though not limited thereto, formed on the same single built-in circuit board thereof.

Figure 6A:
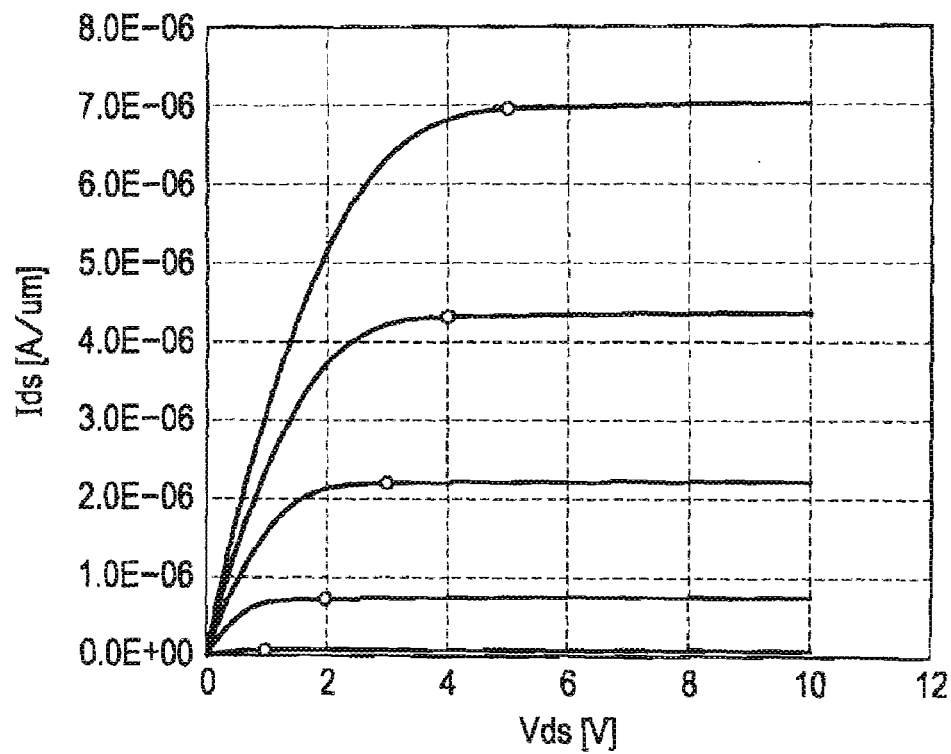
FIG. 6 is a set of graphs that illustrates the voltage-current characteristics of the thin film transistor to which the invention is applied and those of a thin film transistor of related art with a gate voltage being changed for each thereof.
Figure 6B:
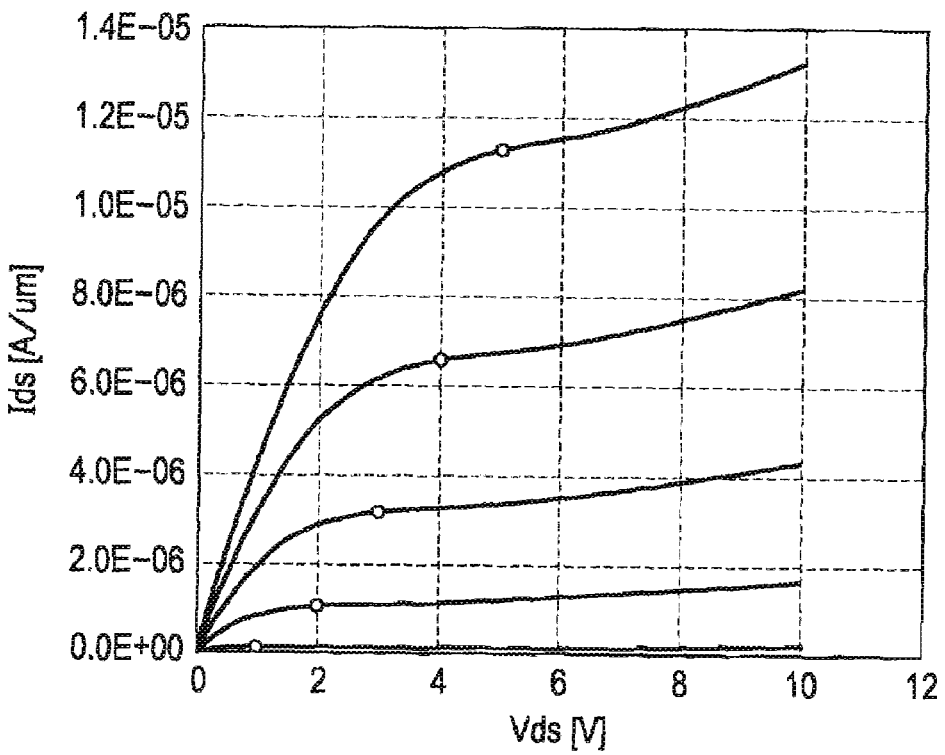

According to the exemplary embodiment of the invention, it is possible to achieve saturation characteristics illustrated in FIG. 6A in a case where the channel length of the source-side second thin film transistor portion 10*b* is set to be 4 μm, and the channel length of the drain-side first thin film transistor portion 10*a* is set to be 1 μm. Thus, it is possible to significantly improve saturation characteristics in comparison with those of a related-art thin film transistor illustrated in FIG. 6B (the channel length thereof is set to be 5 μm). In each of FIGS. 6A and 6B, each white circle denotes a point of Vds=Vgs.

Production Method

Next, with reference to FIGS. 7 and 8, an example of production methods of the thin film transistor according to the present embodiment of the invention is explained. FIGS. 7 and 8 are sectional views that schematically illustrate an exemplary method for production of the thin film transistor according to the present embodiment of the invention on a step-by-step basis. As a first step, as illustrated in FIG. 7A, the transparent substrate 15 made of glass or the like is subjected to ultrasonic cleaning or other alternative cleaning treatment. After preparation of the transparent substrate 15, if needed, a base ground (i.e., underlying) protective film made of a silicon oxide film, which is not shown in the drawing is formed on the entire surface of the transparent substrate 15. A plasma CVD method or other alternative technique is used for the formation of the base ground protective film over the transparent substrate 15 under the substrate temperature conditions ranging from 150 degrees Celsius to 450 degrees Celsius.

Next, in the back gate electrode formation step, a metal film such as a molybdenum film, an aluminum film, a titanium film, a tungsten film, a tantalum film, or a lamination of these films is formed on the entire surface of the transparent substrate 15. Thereafter, the formed metal film is subjected to patterning by means of a photolithography technique so as to form the drain-side back gate electrode 8*a* and the source-side back gate electrode 8*b*. In such a formation process, the drain-side back gate electrode 8*a* is formed at a position that overlaps (i.e., underlies) a region within which the first channel region 1*e* illustrated in FIG. 3 is formed. On the other hand, the source-side back gate electrode 8*b* is formed at a position that overlaps (i.e., underlies) a region within which the second channel region 1*g* illustrated in FIG. 3 is formed.

Figure 7A:
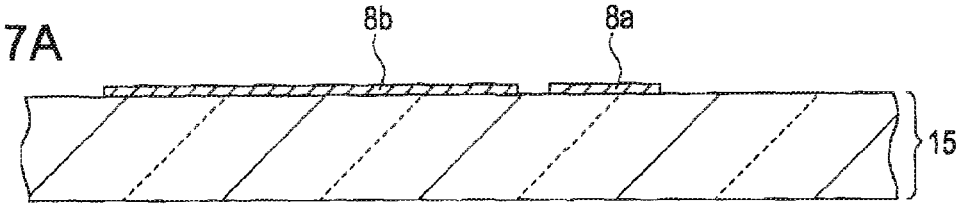
FIG. 7 is a set of sectional views that schematically illustrates an exemplary method for production of the current-controlling thin film transistor according to the first exemplary embodiment of the invention on a step-by-step basis.
Figure 7B:
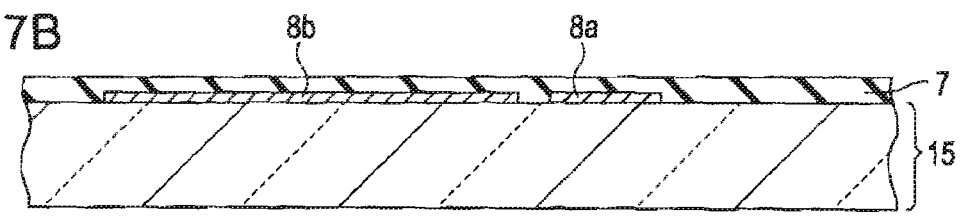

Next, as illustrated in FIG. 7B, the lower-layer-side gate insulation layer 7 made of a silicon oxide film having a thickness ranging from 75 nm to 600 nm, for example, a thickness of approximately 225 nm is formed on the entire surface by means of a CVD method or the like.

Figure 7C:
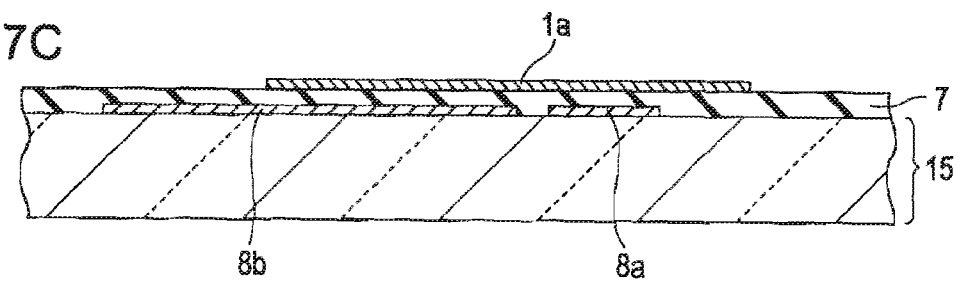

Next, an amorphous silicon film having a thickness of, for example, 40-50 nm is formed on the entire surface by means of a plasma CVD method or the like under the substrate temperature conditions ranging from 150 degrees Celsius to 450 degrees Celsius. Thereafter, the formed silicon film is made into polycrystalline one by means of a laser annealing method, a flash (rapid) heating method, or the like. Subsequently, the silicon film is patterned by means of a photolithography technique so as to form the island-shaped, that is, isolated, polycrystalline silicon film 1*a* as illustrated in FIG. 7C.

Figure 7D:
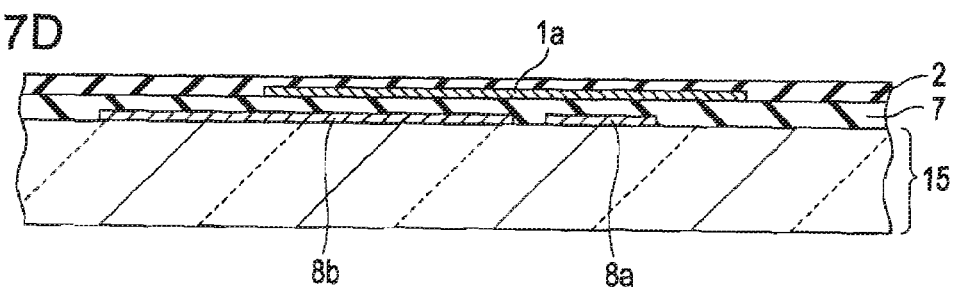

Subsequently, as illustrated in FIG. 7D, the upper-layer-side gate insulation layer 2 made of a silicon oxide film having a thickness of, for example, 75 nm is formed on the surface of the polycrystalline silicon film 1a by means of a CVD method or the like.

Figure 7E:
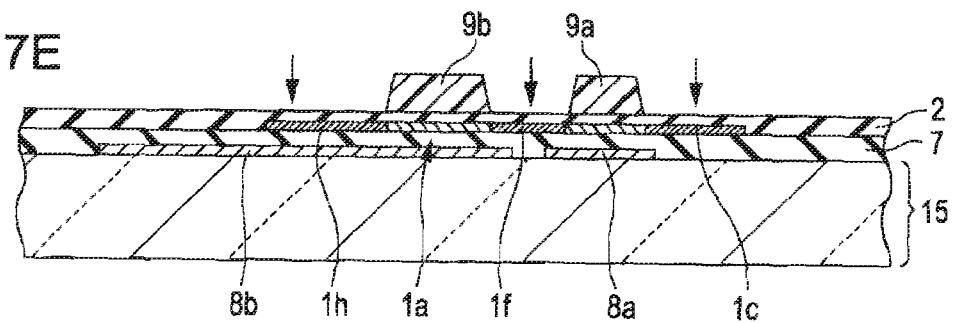

Next, in the highly doped impurity implantation process illustrated in FIG. 7E, after formation of resist masks 9a and 9b on the upper-layer-side gate insulation layer 2, highly doped n-type impurity ion (phosphorus ion) is implanted into the polycrystalline silicon film 1a in a dose amount ranging from, for example, approximately $0.1 \times 10^{15}/cm^2$ to approximately $10 \times 10^{15}/cm^2$. Thereafter, the resist masks 9a and 9b are removed. As a result thereof, the highly doped n-type regions 1c, 1f, and 1h are formed in the polycrystalline silicon film 1a.

Figure 8A:
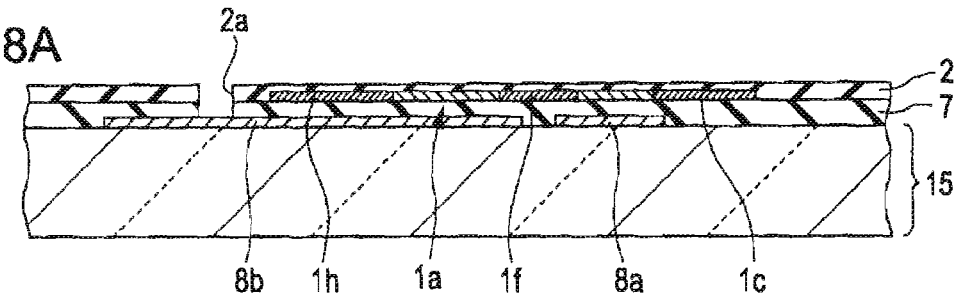
FIG. 8 is a set of sectional views that schematically illustrates the exemplary method for production of the current-controlling thin film transistor according to the first exemplary embodiment of the invention on a step-by-step basis, which are performed after the steps illustrated in FIG. 7.

Next, as illustrated in FIG. 8A, the contact hole 2a that goes through the upper-layer-side gate insulation layer 2 and the lower-layer-side gate insulation layer 7 to reach the source-side back gate electrode 8b is formed. In the same contact-hole formation process, as illustrated in FIG. 3A, the contact hole 2b that goes through the upper-layer-side gate insulation layer 2 and the lower-layer-side gate insulation layer 7 to reach the drain-side back gate electrode 8a is also formed concurrently therewith.

Figure 8B:
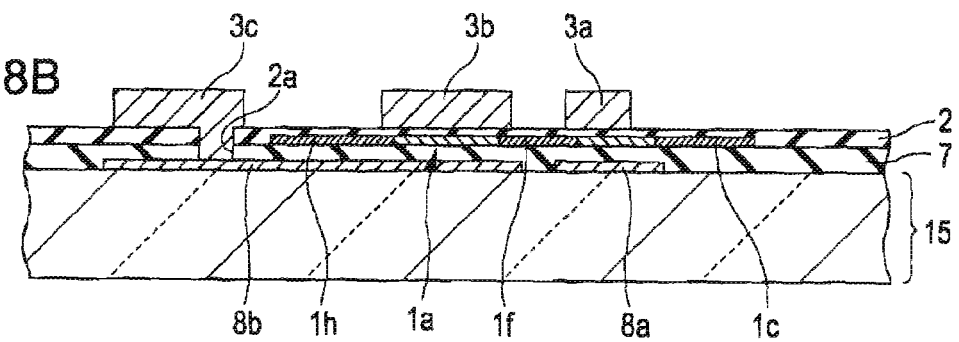

Next, in the front gate electrode formation step illustrated in FIG. 8B, a metal film such as a molybdenum film, an aluminum film, a titanium film, a tungsten film, a tantalum film, or a lamination of these films is formed on the entire surface. Thereafter, the formed metal film is subjected to patterning by means of a photolithography technique so as to form the first front gate electrode 3a, the second front gate electrode 3b, and the relay electrode 3c.

Figure 8C:
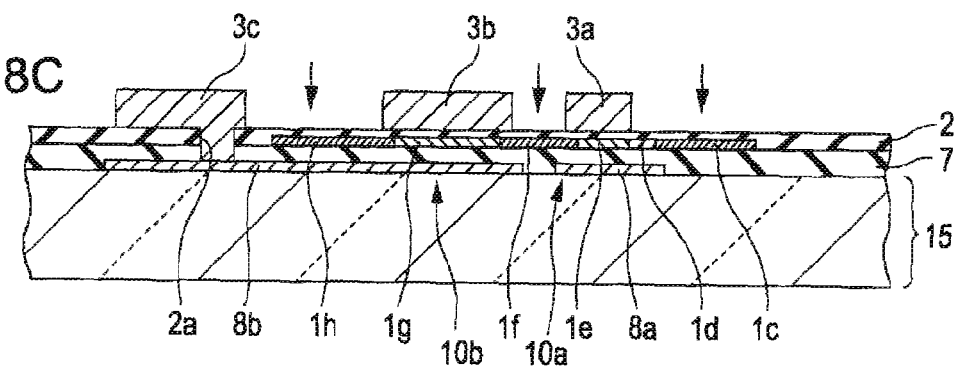

Next, in the lightly doped impurity implantation process illustrated in FIG. 8C, while using the first front gate electrode 3a and the second front gate electrode 3b as masks, lightly doped n-type impurity ion (phosphorus ion) is implanted into the polycrystalline silicon film 1a in a dose amount ranging from, for example, approximately $0.1 \times 10^3/cm^2$ to approximately $10 \times 10^{13}/cm^2$ As a result thereof, the lightly doped n-type region 1d is formed in a self-aligned manner with respect to the first front gate electrode 3a. In addition, the first channel region 1e and the second channel region 1g are formed at regions that are covered by the first front gate electrode 3a and the second front gate electrode 3b, respectively.

Figure 8D:
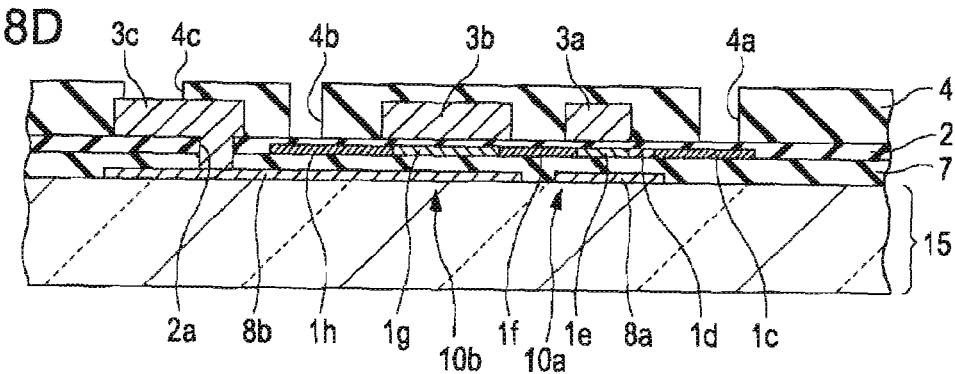

Next, in the inter-bedded insulator film formation step illustrated in FIG. 8D, the inter-bedded insulator film 4 made of a silicon oxide film is formed by means of a CVD method or the like. Thereafter, the contact hole 4a that goes through the inter-bedded insulator film 4 to reach the highly doped n-type region 1c, the contact hole 4b that goes through the inter-bedded insulator film 4 to reach the highly doped n-type region 1h, and the contact hole 4c that goes through the inter-bedded insulator film 4 to reach the relay electrode 3c are formed.

Next, in the source and drain electrode formation step, a metal film such as a molybdenum film, an aluminum film, a titanium film, a tungsten film, a tantalum film, or a lamination of these films is formed on the entire surface. Thereafter, the formed metal film is subjected to patterning by means of a photolithography technique so as to form the drain electrode 6a and the source electrode 6b that are illustrated in FIGS. 3A and 3B.

The thin film transistor 10 that is constituted by the first thin film transistor portion 10a and the second thin film transistor portion 10b can be manufactured as described above. The exemplary production method described above may be modified in such a manner that, after impurity implantation, the element substrate 10 is heated so as to activate the implanted impurity. As another example of modifications thereof, hydrogen ion may be implanted into the polycrystalline silicon film 1a by means of ion shower doping or the like so as to terminate any dangling bond that exists in the polycrystalline silicon film 1a.

Improvement Example of Embodiment 1

Figure 9A:
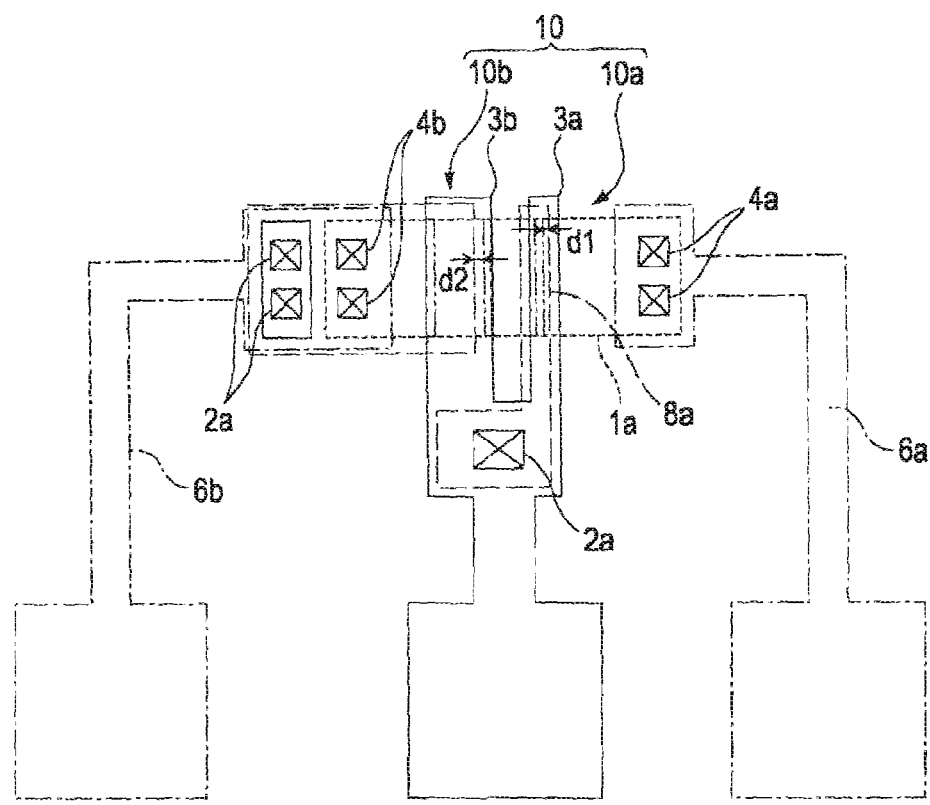
Figure 9B:
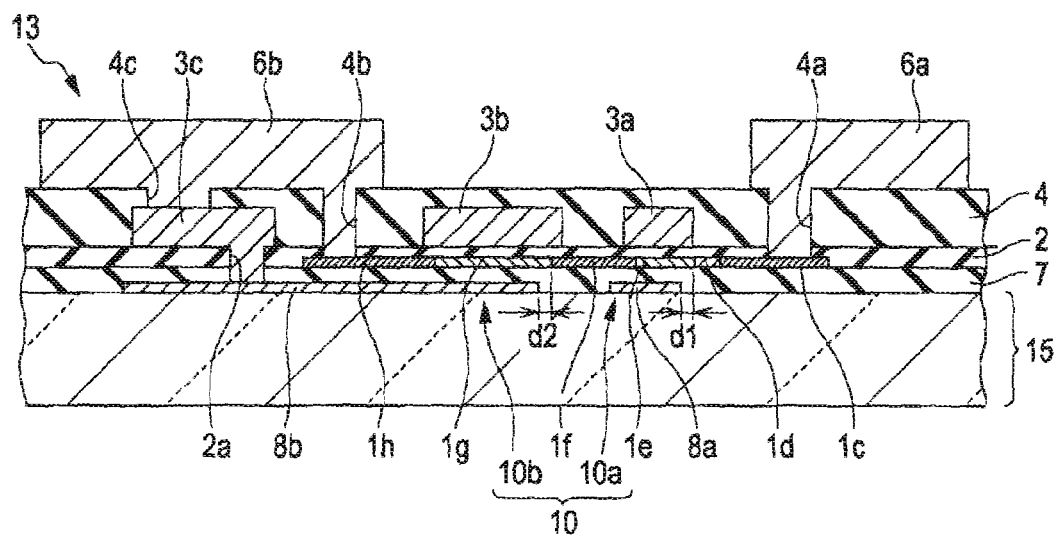
FIG. 9B is a sectional view thereof.

In the exemplary embodiment of the invention described above, the drain-side back gate electrode 8a is formed at a region that overlaps the whole length of the first channel region 1e. In addition, the source-side back gate electrode 8b is formed at a region that overlaps the whole length of the second channel region 1g. However, as illustrated in FIGS. 9A and 9B, it is preferable that the source-side back gate electrode 8b should be formed at a region that overlaps not the whole length but the partial length of the second channel region 1g; more specifically, it is preferable that the source-side back gate electrode 8b should be formed at a region that overlaps the source end of the second channel region 1g but not the drain end thereof in such a manner the drain end of the source-side back gate electrode 8b lies under a "halfway point" that falls short of, that is, does not reach, the drain end of the second channel region 1g when viewed in a direction going from the source end toward the drain end thereof. In other words, it is preferable to form the source-side back gate electrode 8b at a region that leaves a non-overlapping distance of d2 extending from the above-mentioned halfway point that falls short of the drain end of the second channel region 1g to the drain end thereof. The improved configuration described above makes it possible to eliminate the adverse effects of a vertical electric field exerted from the source-side back gate electrode 8b at the drain end of the second channel region 1g.

On the other hand, it is preferable that the drain-side back gate electrode 8a should be formed at a region that overlaps the source end of the first channel region 1e but not the drain end thereof in such a manner the drain end of the drain-side back gate electrode 8a lies under a halfway point that falls short of the drain end of the first channel region 1e when viewed in a direction going from the source end toward the drain end thereof. In other words, it is preferable to form the drain-side back gate electrode 8a at a region that leaves a non-overlapping distance of d1 extending from the above-mentioned halfway point that falls short of the drain end of the first channel region 1e to the drain end thereof. The improved configuration described above makes it possible to eliminate the adverse effects of a vertical electric field exerted from the drain-side back gate electrode 8a at the drain end of the first channel region 1e.

Variation Example of Embodiment 1

In the first exemplary embodiment of the invention described above, both of the drain-side back gate electrode 8a and the source-side back gate electrode 8b are formed. As a variation example of the configuration described above, the source-side back gate electrode 8b only may be formed.

Embodiment 2

Figure 10A:
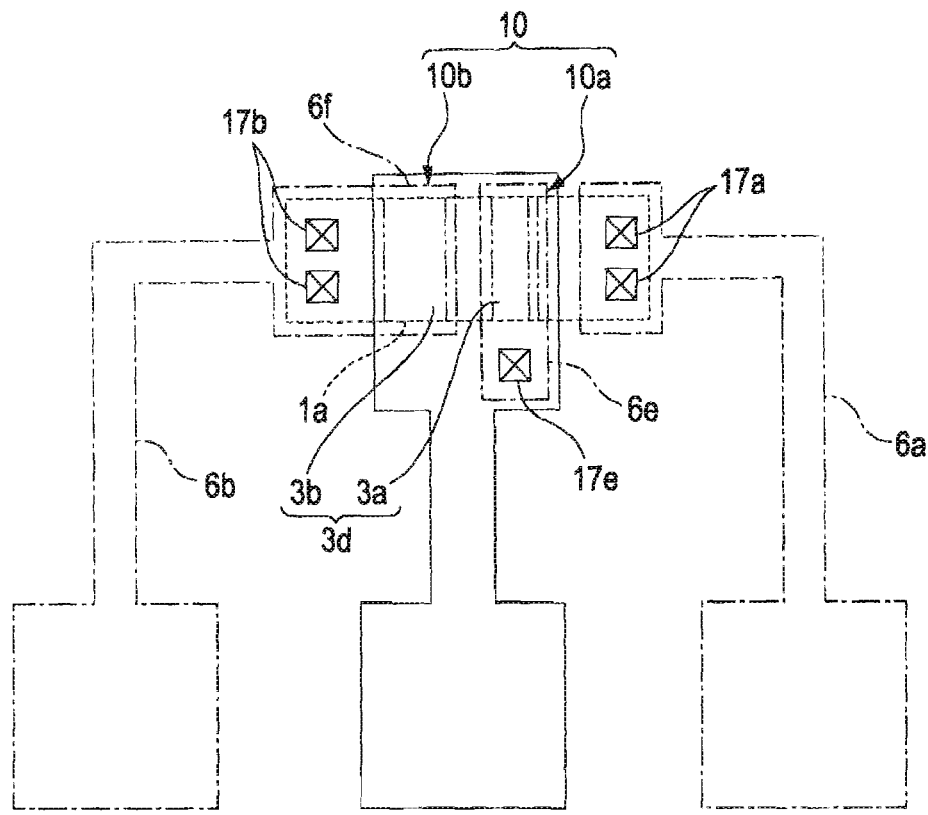
Figure 10B:
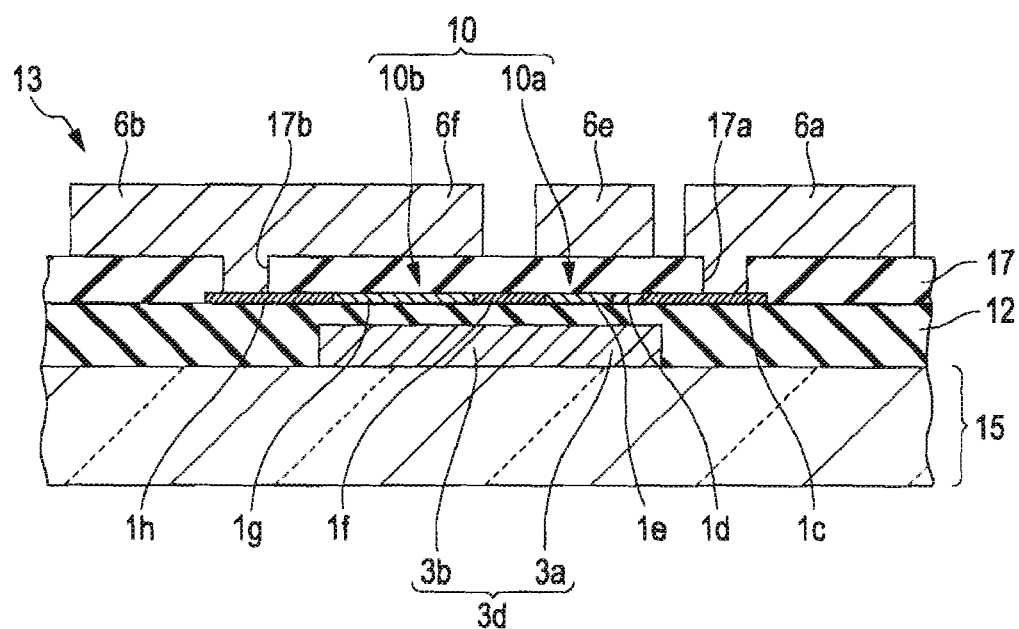
FIG. 10B is a sectional view thereof.

FIG. 10A is a plan view of a current-controlling thin film transistor that is used in a light-emitting device according to the present embodiment of the invention. FIG. 10B is a sectional view thereof. An example illustrated herein has a laminated structure that is made up of a front gate electrode, a lower-layer-side gate insulation layer (a first gate insulation layer), a polycrystalline silicon film, an upper-layer-side gate insulation layer (a second gate insulation layer), and a back gate electrode, which are laminated in the order of appearance herein. In FIG. 10A, a short dashed line indicates the polycrystalline silicon film. A solid line indicates the front gate electrode. An alternate long and snort dash line indicates a source-drain electrode and the back gate electrode. A two-dot chain line indicates each boundary between regions of the polycrystalline silicon film. Except for the lamination order of layers, the basic configuration of the present embodiment of the invention is the same as that of the first exemplary embodiment of the invention described above. Accordingly, in the following description, the same reference numerals are consistently used for the same components as those described in the first exemplary embodiment of the invention so as to omit any redundant explanation thereof.

As in the first exemplary embodiment of the invention described above, in the present embodiment of the invention, a multi-gate structure (i.e., configuration D) explained earlier while making reference to FIGS. 16A, 16B, and 16C is adopted when configuring the current-controlling thin film transistor 10 illustrated in FIG. 1A. As illustrated in FIG. 1B, in such a multi-gate configuration, the drain-side thin film transistor (TFTd) and the source-side thin film transistor (TFTs) are connected in series. In addition, the gate electrode (i.e., front gate) of the drain-side thin film transistor TFTd and the gate electrode (front gate) of the source-side thin film transistor TFTs are electrically connected to each other. In addition, in the configuration of the current-controlling thin film transistor 10 according to the present embodiment of the invention, each of the drain-side thin film transistor TFTd and the source-side thin film transistor TFTs is provided with a back gate. The back gate of the drain-side thin film transistor TFTd, which is referred to as the drain-side back gate hereunder, is electrically connected to the front gate thereof. A source potential/voltage is applied to the back gate of the source-side thin film transistor TFTs, which is referred to as the source-side back gate hereunder.

As illustrated in FIGS. 10A and 10B, in a formation process of the current-controlling thin film transistor 10, a base ground protective film made of a silicon oxide film, a silicon nitride film, or the like, which is not shown in the drawings, is formed on the transparent substrate 15 of the element substrate (semiconductor device) 13 according to the present embodiment of the invention; and then, the first front gate electrode 3a and the second front gate electrode 3b are formed as an integrated single-piece front gate electrode 3d on the surface of the base ground protective film. A lower-layer-side gate insulation layer (a first gate insulation layer) 12 is formed on the first front gate electrode 3a and the second front gate electrode 3b.

The island-shaped isolated polycrystalline silicon film 1a is formed on the lower-layer-side gate insulation layer 12. The polycrystalline silicon film da is a film formed by, as a first step, depositing an amorphous silicon film on the element substrate 13, and then by processing the film into polycrystalline one by means of laser annealing, lamp annealing, or the like. An upper-layer-side gate insulation layer (a second gate insulation layer) 17 made of a silicon oxide film, a silicon nitride film, or the like is deposited on the surface of the polycrystalline silicon film 1a.

The thin film transistor 10 according to the present embodiment of the invention has a first n-channel thin film transistor portion 10a that has a first channel region 1e formed at the drain-side position of the polycrystalline silicon film 1a and a second n-channel thin film transistor portion 10b that is formed at the source-side position adjacent to the drain-side first n-channel thin film transistor portion 10a. The second thin film transistor portion 10b has the second channel region 1g that is formed at a source-side position opposite to the drain-side first channel region 1e with the highly doped n-type region 1f (i.e., impurity implantation region) being interposed therebetween in the polycrystalline silicon film 1a. The first thin film transistor portion 10a and the second thin film transistor portion 10b are connected in series so as to form the n-channel thin film transistor 10. It should be noted that the channel length of the first thin film transistor portion 10a is set to be shorter than the channel length of the second thin film transistor portion 10b.

The first thin film transistor portion 10a has the lightly doped n-type region 1d at a position that is adjacent to the first channel region 1e at the drain side thereof. The lightly doped n-type region 1d is formed at a region that overlaps the first front gate electrode 3a of the front gate electrode 3d. The first thin film transistor portion 10a has not any lightly doped n-type region at a position that is adjacent to the first channel region 1e at the source side thereof. The second thin film transistor portion 10b has neither an LDD structure nor a self-aligned structure. The second channel region 1g of the second thin film transistor portion 10b is formed at a region of the polycrystalline silicon film 1a that overlaps, that is, underlies, the central region of the second front gate electrode 3b of the front gate electrode 3d only when viewed along the longitudinal direction thereof, meaning that it does not extend beyond the area overlapping the central region thereof. With the configuration described above, the polycrystalline silicon film 1a has the highly doped n-type region 1c, the lightly doped n-type region 1d, the first channel region 1e, the highly doped n-type region 1f, the second channel region 1g, and the highly doped n-type region 1h, which are formed/arrayed in the order of appearance herein when viewed from the drain side toward the source side thereof. The highly doped n-type region 1c, the lightly doped n-type region 1d, the first channel region 1e, and the highly doped n-type region 1f constitute the first thin film transistor portion 10a. The highly doped n-type region 1f, the second channel region 1g, and the highly doped n-type region 1h constitute the second thin film transistor portion 10b. The highly doped n-type region 1f functions as a node for the first thin film transistor portion 10a and the second thin film transistor portion 10b.

The upper-layer-side gate insulation layer (the second gate insulation layer) 17 is formed on the polycrystalline silicon film 1a. The drain electrode 6a and the source electrode 6b are formed on the upper-layer-side gate insulation layer 17. The drain electrode 6a is electrically connected to the highly doped n-type region 1c via a contact hole 17a that is formed so as to go through the upper-layer-side gate insulation layer 17. On the other hand, the source electrode 6b is electrically connected to the highly doped n-type region 1h via a contact hole 17b that is formed so as to go through the upper-layer-side gate insulation layer 17.

The drain-side back gate electrode 6e is formed on the upper-layer-side gate insulation layer 17 at a position opposed to the first channel region 1e with the upper-layer-side gate insulation layer 17 being sandwiched therebetween. The drain-side back gate electrode 6e is electrically connected to the first front gate electrode 3a of the front gate electrode 3d via a contact hole 17e. The contact hole 17e, which goes through the upper-layer-side gate insulation layer 17 and the lower-layer-side gate insulation layer 12, is formed at a certain side/peripheral position of the polycrystalline silicon film 1a.

The source-side back gate electrode 6f is formed at one end of the source electrode 6b on the upper-layer-side gate insulation layer 17 at a position opposed to the second channel region 1g with the upper-layer-side gate insulation layer 17 being sandwiched therebetween. A source potential/voltage is applied to the source-side back gate electrode 6f.

Advantageous Effects of Present Embodiment of Invention

As explained above, the thin film transistor 10 according to the present embodiment of the invention adopts the configuration D that is explained above while making reference to FIG. 16, which is the same as the first exemplary embodiment of the invention described above. The first thin film transistor portion 10a corresponds to the drain-side thin film transistor TFTd that is illustrated in FIG. 16A. The second thin film transistor portion 10b corresponds to the source-side thin film transistor TFTs that is illustrated in FIG. 16A. The operating characteristics of the thin film transistor 10 are schematically illustrated in FIG. 16c. Therefore, the operating point of the thin film transistor 10 lies in the proximity of the pinch off voltage point of the source-side second thin film transistor portion 10b. Therefore, it is possible to avoid the kink effects of the second thin film transistor portion 10b.

In addition, in the configuration of the current-controlling thin film transistor 10 according to the present embodiment of the invention, the first thin film transistor portion 10a and the second thin film transistor portion 10b are provided with the drain-side back gate electrode 6e and the source-side back gate electrode 6f, respectively. The back gate electrode 6e of the drain-side thin firm transistor TFTD is electrically connected to the first front gate 3a thereof. A source potential/voltage is applied to the back gate electrode 6f of the source-side thin film transistor TFTs. With such a configuration, as in the first exemplary embodiment of the invention, it is possible to make a conductance gm of the source-side second thin film transistor portion 10b relatively low and to make the conductance gm of the drain-side first thin film transistor portion 10a relatively high. For this reason, it is further possible to set the operating point of the thin film transistor 10 at a position where Vm is higher than the pinch off voltage point of the second thin film transistor portion 10b without any necessity to set a value calculated as the result of dividing the channel width Wa of the first thin film transistor portion 10a by the channel length La thereof (Wa/La) significantly larger than a value calculated as the result of dividing the channel width Wb of the second thin film transistor portion 10b by the channel length Lb thereof (Wb/Lb). In such a region, the inclination of the source-drain current Ids relative to the source-drain voltage Vds is small. For this reason, it is possible to make the rate of change in the level of a drain current in the saturation region smaller without increasing the area occupancy of the thin film transistor 10, thereby remarkably enhancing the saturated operations thereof. That is, the present embodiment of the invention can achieve the same advantageous effects as those achieved by the first exemplary embodiment of the invention.

Production Method

Next, with reference to FIG. 11, an example of production methods of the thin film transistor according to the present embodiment of the invention is explained. FIG. 11 is a sectional view that schematically illustrates an exemplary method for production of the thin film transistor according to the present embodiment of the invention on a step-by-step basis. As a first step, as illustrated in FIG. 11A, the transparent substrate 15 made of glass or the like is subjected to ultrasonic cleaning or other alternative cleaning treatment. After preparation of the transparent substrate 15, if needed, a base ground protective film made of a silicon oxide film, which is not shown in the drawing, is formed on the entire surface of the transparent substrate 15. A plasma CVD method or other alternative technique is used for the formation of the base ground protective film over the transparent substrate 15 under the substrate temperature conditions ranging from 150 degrees Celsius to 450 degrees Celsius.

Next, in the front gate electrode formation step, a metal film such as a molybdenum film, an aluminum film, a titanium film, a tungsten film, a tantalum film, or a lamination of these films is formed on the entire surface of the transparent substrate 15. Thereafter, the formed metal film is subjected to patterning by means of a photolithography technique so as to form the front gate electrode 3d, which includes the first front gate electrode 3a and the second front gate electrode 3b.

Figure 11A:
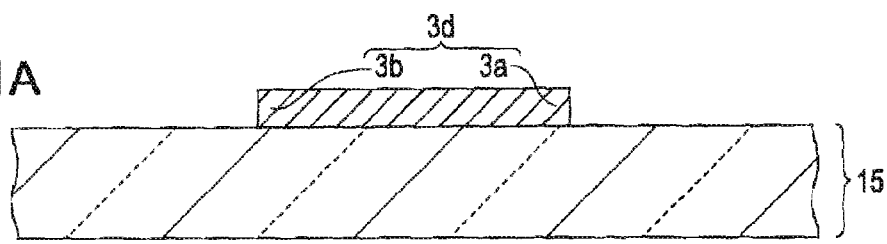
FIG. 11 is a set of sectional views that schematically illustrates an exemplary method for production of the current-controlling thin film transistor according to the second exemplary embodiment of the invention on a step-by-step basis.
Figure 11B:
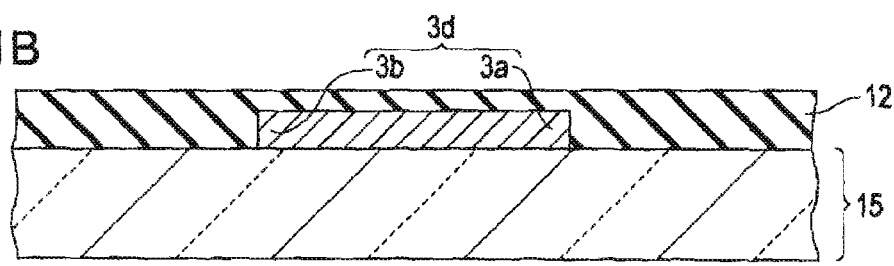

Next, as illustrated in FIG. 11B, the lower-layer-side gate insulation layer 12 made of a silicon oxide film is formed on the entire surface by means of a CVD method or the like.

Figure 11C:
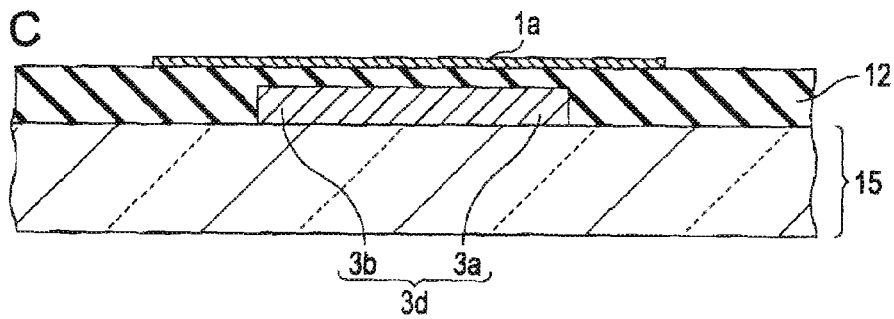

Next, an amorphous silicon film having a thickness of, for example, 40-50 nm is formed on the entire surface by means of a plasma CVD method or the like under the substrate temperature conditions ranging from 150 degrees Celsius to 450 degrees Celsius. Thereafter, the formed silicon film is made into polycrystalline one by means of a laser annealing method, a flash (rapid) heating method, or the like. Subsequently, the silicon film is patterned by means of a photolithography technique so as to form the island-shaped, that is, isolated, polycrystalline silicon film 1a as illustrated in FIG. 11C.

Figure 11D:
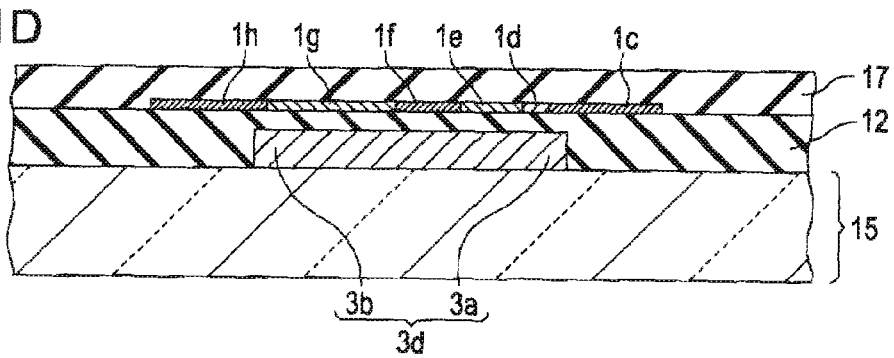

Subsequently, as illustrated in FIG. 11D, the upper-layer-side gate insulation layer 17 made of a silicon oxide film having a thickness ranging from 75 nm to 600 nm, for examples a thickness of approximately 225 nm is formed on the surface of the polycrystalline silicon film 1a by means of a CVD method or the like.

Next, in the impurity implantation process, while using resist masks that are not shown in the drawing, highly doped n-type impurity ion (phosphorus ion) is implanted into the polycrystalline silicon film 1a, which is followed by implantation of lightly doped n-type impurity ion (phosphorus ion) into the polycrystalline silicon film 1a. As a result of the impurity implantation processing described above, the highly doped n-type region 1c, the lightly doped n-type region 1d, the highly doped n-type region 1f, and the highly doped n-type region 1h are formed in the polycrystalline silicon film 1a. Remaining regions where no impurity is implanted constitute the first channel region 1e and the second channel region 1g.

Figure 11E:
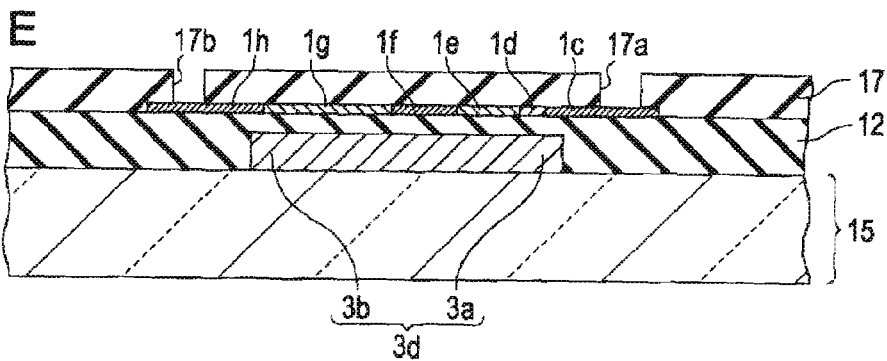

As a next step, as illustrated in FIG. 11E, the contact holes 17a and 17b are formed in the upper-layer-side gate insulation layer 17. The contact holes 17a and 17b go through the upper-layer-side gate insulation layer 17 to reach the highly doped n-type regions 1c and 1h, respectively. In addition, as illustrated in FIG. 10A, the contact hole 17e that goes through the upper-layer-side gate insulation layer 17 and the lower-layer-side gate insulation layer 12 to reach the first front gate electrode 3a of the front gate electrode 3d is formed.

Next, in the source-drain electrode formation step, a metal film such as a molybdenum film, an aluminum film, a titanium film, a tungsten film, a tantalum film, or a lamination of these films is formed on the entire surface. Thereafter, the formed metal film is subjected to patterning by means of a photolithography technique so as to form the drain electrode 6a, the source electrode 6b, the drain-side back gate electrode 6e, and the source-side back gate electrode 6f, which are illustrated in FIGS. 10A and 10B.

Improvement Example of Embodiment 2

Figure 12A:
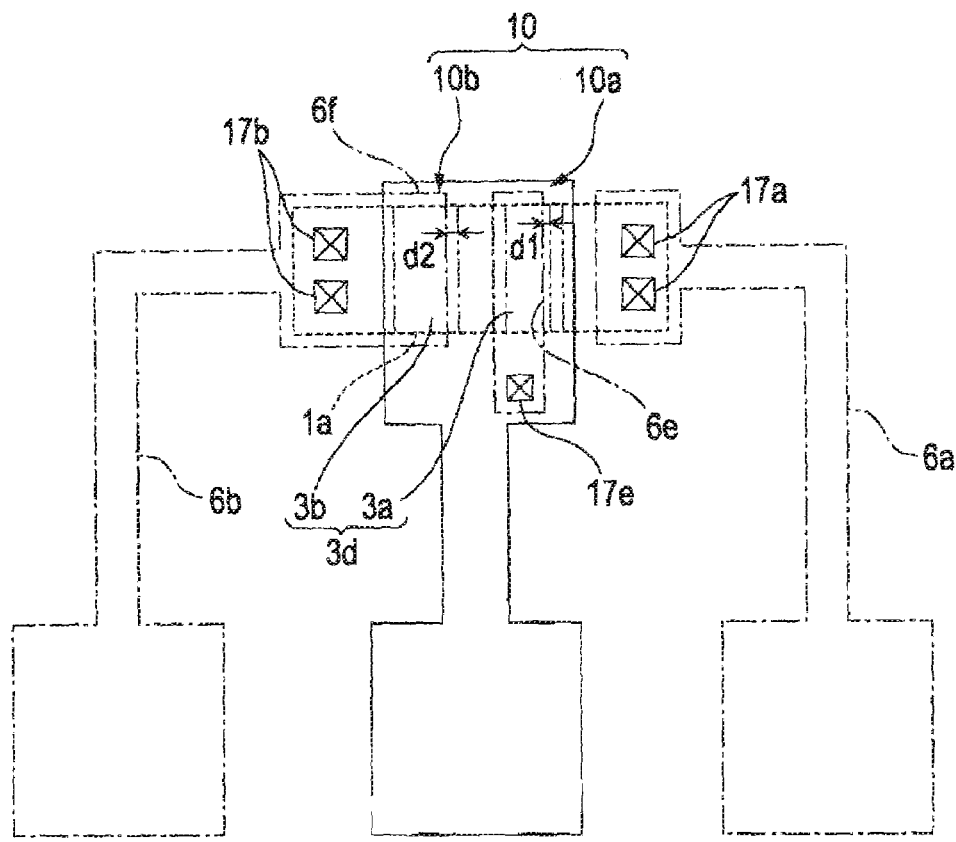
Figure 12B:
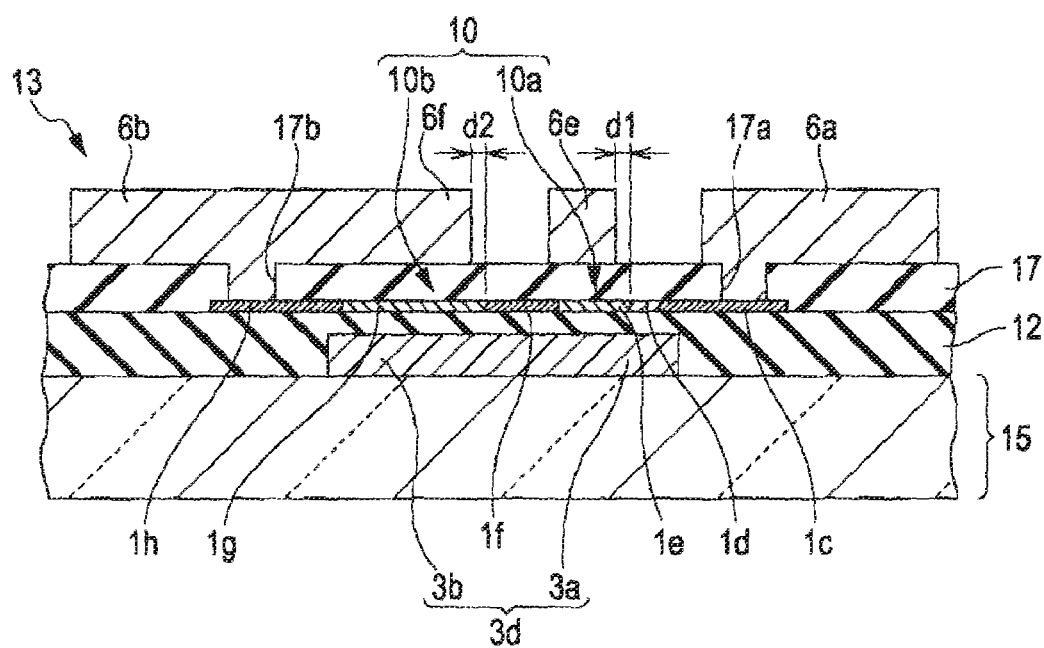
FIG. 12B is a sectional view thereof.

In the exemplary embodiment of the invention described above, the drain-side back gate electrode 6e is formed at a region that overlaps (i.e., overlies) the whole length of the first channel region 1e. In addition, the source-side back gate electrode 6f is formed at a region that overlaps the whole length of the second channel region 1g. However, as illustrated in FIGS. 12A and 12B, it is preferable that the source-side back gate electrode 6f should be formed at a region that overlaps not the whole length but the partial length of the second channel region 1g; more specifically, it is preferable that the source-side back gate electrode 6f should be formed at a region that overlaps the source end of the second channel region 1g but not the drain end thereof in such a mariner the drain end of the source-side back gate electrode 6f lies over a "halfway point" that falls short of the drain end of the second channel region 1g when viewed in a direction going from tile source end toward the drain end thereof. In other words, it is preferable to form the source-side back gate electrode 6f at a region that leaves a non-overlapping distance of d2 extending from the above-mentioned halfway point that falls short of the drain end of the second channel region 1g to he drain end thereof. The improved configuration described above makes it possible to eliminate the adverse effects of a vertical electric field exerted from the source-side back gate electrode 6f at the drain end of the second channel region 1g.

On the other hand, it is preferable that the drain-side back gate electrode 6e should be formed at a region that overlaps the source end of the first channel region 1e but not the drain end thereof in such a manner the drain end of the drain-side back gate electrode 6e lies over a halfway point that falls short of the drain end of the first channel region 1e when viewed in a direction going from the source end toward the drain end thereof. In other words, it is preferable to form the drain-side back gate electrode 6e at a region that leaves a non-overlapping distance of d1 extending from the above-mentioned halfway point that falls short of the drain end of the first channel region 1e to the drain end thereof. The improved configuration described above makes it possible to eliminate the adverse effects of a vertical electric field exerted from the drain-side back gate electrode 6e at the drain end of the first channel region 1e.

Variation Example of Embodiment 2

In the second exemplary embodiment of the invention described above, both of the drain-side back gate electrode 6e and the source-side back gate electrode 6f are formed. As a variation example of the configuration described above, the source-side back gate electrode 6f only may be formed.

Other Exemplary Embodiments

Figure 13:
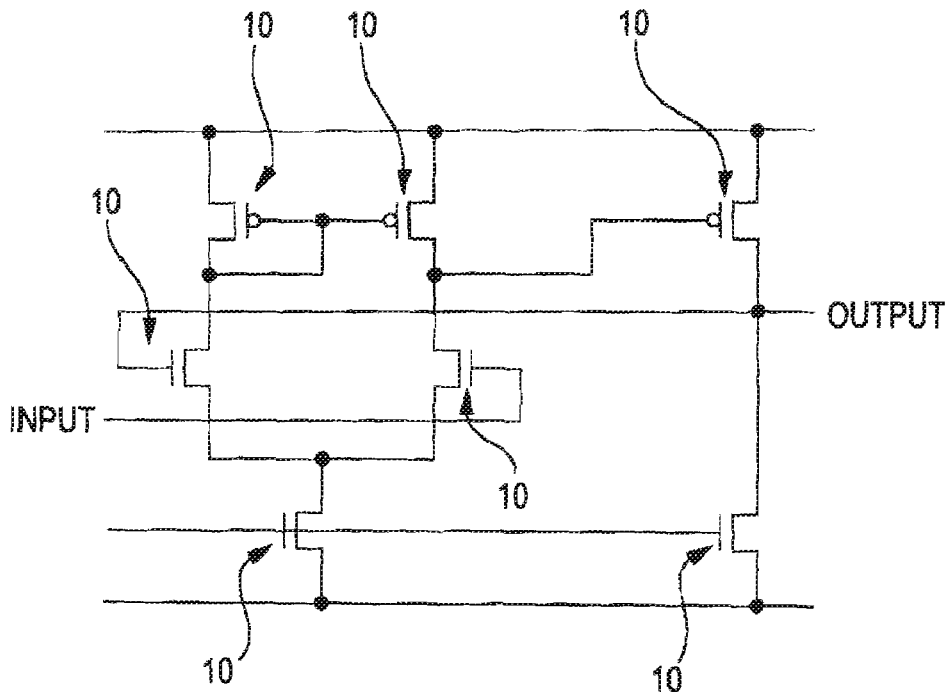
FIG. 13 is an explanatory diagram of a driving circuit that is formed on an element substrate of a liquid crystal device as another example of semiconductor devices to which the invention is applied.
Figure 14:
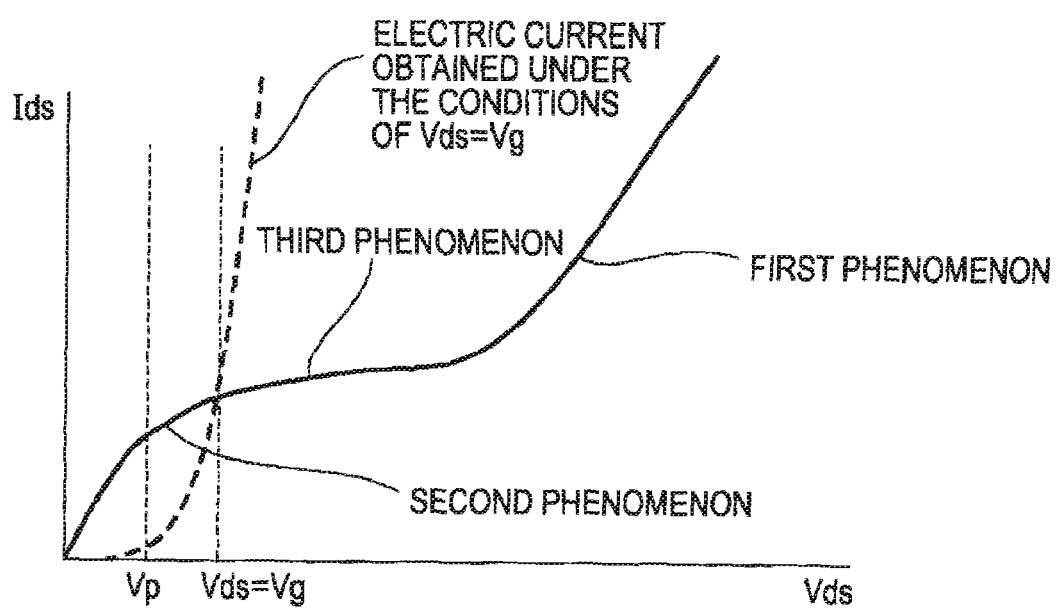
FIG. 14 is an explanatory diagram that illustrates the problems of a thin film transistor of related art.
Figure 15A:
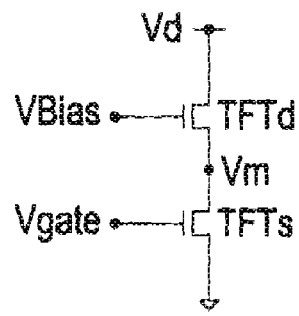
FIG. 15 is a set of explanatory diagrams that illustrates two cascode-connected thin film transistor portions.
Figure 15B:
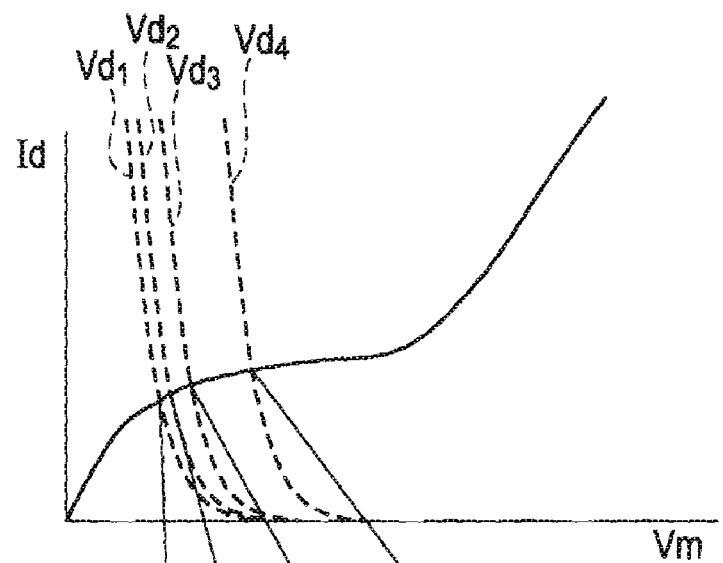
Figure 15C:
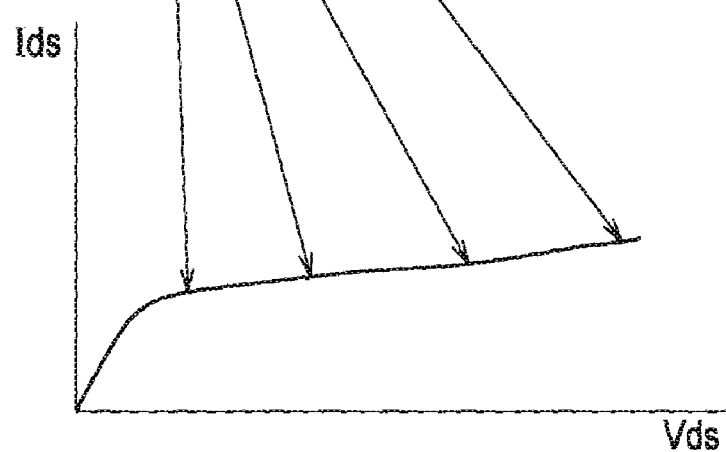

In each of the exemplary embodiments of the invention described above, the thin film transistor 10 is configured as an n-type transistor. However, the thin film transistor 10 can be modified into a p-type transistor only by replacing the n-type with the p-type in the configuration and the production method described above. In each of the exemplary embodiments of the invention described above, the element substrate 13 of the light-emitting device 100 that has the organic EL element 40 is taken as an example of a variety of semiconductor devices. However, the invention is not limitedly applied to such a specific example. For example, an analog circuit such as an operational amplifier illustrated in FIG. 13 is provided on the element substrate (semiconductor device) of a liquid crystal device as a driving circuit thereof. If the thin film transistor 10 to which the invention is applied is adopted as a constituent element of a driving transistor, a current mirror circuit, and an output circuit, it is possible to configure an output buffer that offers an excellent linearity with a small offset.

What is claimed is:

1. A semiconductor device comprising:
   a substrate; and
   a thin film transistor that uses a polycrystalline silicon film disposed over the substrate as an active layer thereof,
   wherein the polycrystalline silicon film is sandwiched between a first gate insulation layer and a second gate insulation layer,
   the thin film transistor has a first thin film transistor portion and a second thin film transistor portion,
      the first thin film transistor portion having a first channel region and a first front gate electrode, the first channel region being formed at the drain-side position of the polycrystalline silicon film, the first front gate electrode being opposed to the first channel region with the first gate insulation layer being sandwiched therebetween,
      the second thin film transistor portion having a second channel region and a second front gate electrode, the second channel region being formed at a source-side position adjacent indirectly to the drain-side first channel region with an impurity implantation region being interposed therebetween in the polycrystalline silicon film, the second front gate electrode being opposed to the second channel region with the first gate insulation layer being sandwiched therebetween,
   the first thin film transistor portion has the same conductivity type as that of the second thin film transistor portion, the first thin film transistor portion and the second thin film transistor portion being connected in series,
   the first front gate electrode and the second front gate electrode are electrically connected to each other, and
   a source-side back gate electrode is formed at a region that is opposed to the second channel region with the second gate insulation layer being sandwiched therebetween, a source potential being applied to the source-side back gate electrode.

2. The semiconductor device according to claim 1, wherein the source-side back gate electrode is formed at a region overlapping a part of the second channel region extending from the source end to a halfway point without reaching the drain end thereof.

3. The semiconductor device according to claim 1, wherein a drain-side back gate electrode that is electrically connected to the first front gate electrode is formed at a region that is opposed to the first channel region with the second gate insulation layer being sandwiched therebetween.

4. The semiconductor device according to claim 3, wherein the drain-side back gate electrode is formed at a region overlapping a part of the first channel region extending from the source end to a halfway point without reaching the drain end thereof.

5. The semiconductor device according to claim 1, wherein the second gate insulation layer, the polycrystalline silicon film, and the first gate insulation layer are laminated over the substrate in the order of appearance herein.

6. The semiconductor device according to claim 1, wherein the first gate insulation layer, the polycrystalline silicon film, and the second gate insulation layer are laminated over the substrate in the order of appearance herein.

7. An electro-optical device having the semiconductor device according to claim 1, wherein the semiconductor device is an element substrate having a plurality of pixels formed thereon.

* * * * *